US010126665B2

United States Patent

(12) Miyamoto et al.

(10) Patent No.: US 10,126,665 B2
(45) Date of Patent: Nov. 13, 2018

(54) PERIPHERAL EXPOSURE METHOD AND APPARATUS THEREFOR

(71) Applicant: TOKYO ELECTRON LIMITED, Tokyo (JP)

(72) Inventors: Kenichi Miyamoto, Koshi (JP); Minoru Kubota, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 211 days.

(21) Appl. No.: 14/993,647

(22) Filed: Jan. 12, 2016

(65) Prior Publication Data

US 2016/0124324 A1 May 5, 2016

Related U.S. Application Data

(62) Division of application No. 13/773,741, filed on Feb. 22, 2013, now Pat. No. 9,268,230.

(30) Foreign Application Priority Data

Feb. 23, 2012 (JP) ................................. 2012-037010

(51) Int. Cl.
*G03F 7/20* (2006.01)

(52) U.S. Cl.
CPC ........ *G03F 7/70875* (2013.01); *G03F 7/2028* (2013.01); *G03F 7/2041* (2013.01)

(58) Field of Classification Search
CPC ............................. G03F 7/2028; G03F 7/2041
See application file for complete search history.

(56) References Cited

FOREIGN PATENT DOCUMENTS

| | | | |
|---|---|---|---|
| JP | 02-148830 | A | 6/1990 |
| JP | 3-83322 | A | 4/1991 |
| JP | 10-214782 | A | 8/1998 |

*Primary Examiner* — Michelle M Iacoletti
(74) *Attorney, Agent, or Firm* — Nath, Goldberg & Meyer; Jerald L. Meyer

(57) ABSTRACT

A peripheral exposure method for performing an exposure treatment by illuminating light to a periphery of a resist film formed on a substrate to be processed is discussed. The method includes rotating the substrate to be processed on a horizontal plane, bringing a coolant gas into contact with the periphery of the resist film of the substrate to be processed which is being rotated, and cooling the substrate to be processed. Further, the method also includes measuring a temperature of the substrate to be processed, wherein when the temperature of the substrate to be processed is equal to or less than a predetermined temperature, the exposure treatment is performed.

9 Claims, 18 Drawing Sheets

PERIPHERAL EXPOSURE METHOD AND APPARATUS THEREFOR

CROSS-REFERENCE TO RELATED APPLICATION

This is a Divisional Application of U.S. patent application Ser. No. 13/773,741, filed Feb. 23, 2013, an application claiming benefit of Japanese Application No. 2012-37010, filed on Feb. 23, 2012 in the Japan Patent Office, the disclosure of which is incorporated herein in its entirety by reference.

TECHNICAL FIELD

The present disclosure relates to a peripheral exposure method and an apparatus therefor, which perform an exposure treatment on a substrate to be processed such as a semiconductor wafer or an LCD glass substrate on which a resist film is coated.

BACKGROUND

In general, for example, a semiconductor wafer manufacturing process, a photolithography technique is used to form a pattern of a resist film on a surface of a substrate to be processed such as a semiconductor wafer or an LCD substrate. Such a photolithography technique includes a resist coating process which coats a resist solution on the surface (upper surface) of the substrate to be processed, an exposing process which exposes a pattern on the resist film with the resist solution coated thereon, and a developing process which supplies a developer on the substrate to be processed after the exposing process.

In this case, the resist coating process supplies (drops or discharges) the resist solution on the surface of the substrate to be processed under rotating, and forms the resist film on the surface of the substrate to be processed by virtue of a centrifugal force. As such, a thickness of the resist film in a peripheral portion of the substrate to be processed becomes thicker, thus causing a poor film thickness uniformity of the surface of the substrate to be processed. In addition, in the course of transferring or processing the substrate to be processed, a surplus resist film residing the peripheral portion is stripped away, which causes particles.

To overcome this problem, there is a technique which forms the resist film on the surface of the substrate to be processed, exposes the peripheral portion of the substrate to be processed, and removes the surplus resist film residing the peripheral portion of the surface of the substrate to be processed by the developing process. In such a technique, a heating treatment is performed to evaporate and remove a residual solvent from the resist film, which causes a variation in characteristic of the resist film depending on a heating temperature. Specifically, it is found that a resist droop, which represents that a cross section of the resist film which is formed by the removal process is smoothly inclined, occurred, and also a width of the resist droop is varied depending on the temperature of the substrate to be processed at the beginning of the peripheral exposure treatment.

Hence, in order to surely remove the surplus resist film by exposing and developing the peripheral portion of the substrate to be processed, there is need to control the temperature of the exposure region of the substrate to be processed.

As an apparatus which exposes the peripheral portion of the substrate to be processed in a state where the temperature of the resist film formed on the surface of the substrate to be processed is controlled, there has been known a peripheral exposure apparatus which includes a temperature controller installed at the rear side (lower surface) of the substrate to be processed. In the conventional peripheral exposure apparatus, the temperature controller includes a cooling mechanism which cools the substrate to be processed by blowing a cooling fluid. The temperature controller controls the cooling mechanism such that the temperature of the peripheral portion of the surface of the substrate to be processed is controlled.

However, the conventional peripheral exposure apparatus controls a temperature of the exposure region of the surface of the substrate to be processed performing at the lower surface side. As such, when a thermal capacity of the substrate to be processed is lager, in case of a wafer which has a diameter of 450 mm and has a thermal capacity of 2.7 times larger than, e.g., a conventional wafer having a diameter of 300 mm, a time is required to control a temperature of the resist film formed on the surface of the substrate to be processed to a predetermined temperature. This causes a decrease in efficiency of the peripheral exposure treatment.

SUMMARY

The present disclosure provides to a peripheral exposure method and an apparatus therefor, which control a temperature of a peripheral portion of a resist film formed on a surface of a substrate to be processed in a relatively short period of time prior to an exposure treatment, thereby enhance efficiency in a peripheral exposure treatment.

According to one embodiment of the present disclosure, a peripheral exposure method for performing an exposure treatment by illuminating light to a periphery of a resist film formed on a substrate to be processed is discussed. The method includes rotating the substrate to be processed on a horizontal plane; bringing a coolant gas into contact with the periphery of the resist film of the substrate to be processed which is being rotated, and cooling the substrate to be processed; and measuring a temperature of the substrate to be processed, wherein when the temperature of the substrate to be processed is equal to or less than a predetermined temperature, the exposure treatment is performed.

According to another embodiment of the present disclosure, provided is a peripheral exposure apparatus for performing an exposure treatment by illuminating light to a periphery of a resist film formed on a substrate to be processed. The peripheral exposure apparatus includes a substrate holder configured to horizontally hold the substrate to be processed; a driving unit configured to rotate the substrate holder on a horizontal plane; a light source unit having a light source configured to illuminate light with respect to the periphery of the substrate to be processed; a temperature measurement unit configured to measure a temperature of the substrate to be processed; a cooler configured to bring a coolant gas into contact with the periphery of the resist film of the substrate to be processed and configured to cool the substrate to be processed; a moving unit configured to move the cooler to a position in the vicinity of an upper surface of the substrate to be processed and a standby position; and a control unit configured to control the substrate holder, the driving unit, the light source unit, the temperature measurement unit, the cooler and the moving unit, wherein in a state where the substrate to be processed is horizontally held, the substrate holder rotates on the horizontal plane based on a signal provided from the control unit, wherein in a state where the cooler is moved to the position in the vicinity of the upper surface of the substrate to be processed, the substrate to be processed is cooled by the cooler, wherein when the temperature of the substrate to be processed is equal to or less than a predetermined temperature, the exposure treatment is performed by the light source unit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A first embodiment of the present disclosure will now be described in detail with reference to the drawings. Herein, the case where a peripheral exposure apparatus (method) according to the present disclosure is applied to a resist coating/developing system for wafer W (as a substrate to be processed) is described.

Figure 1:
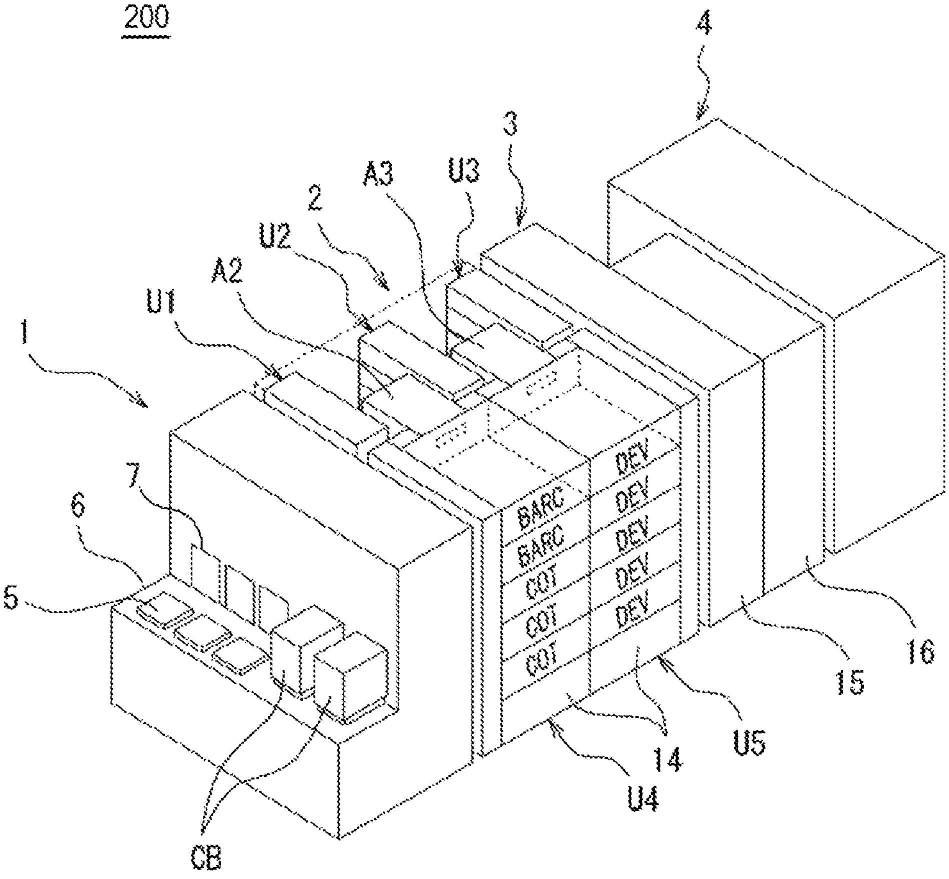
FIG. 1 is a schematic perspective view of a resist coating/developing system according to the present disclosure.
Figure 2:
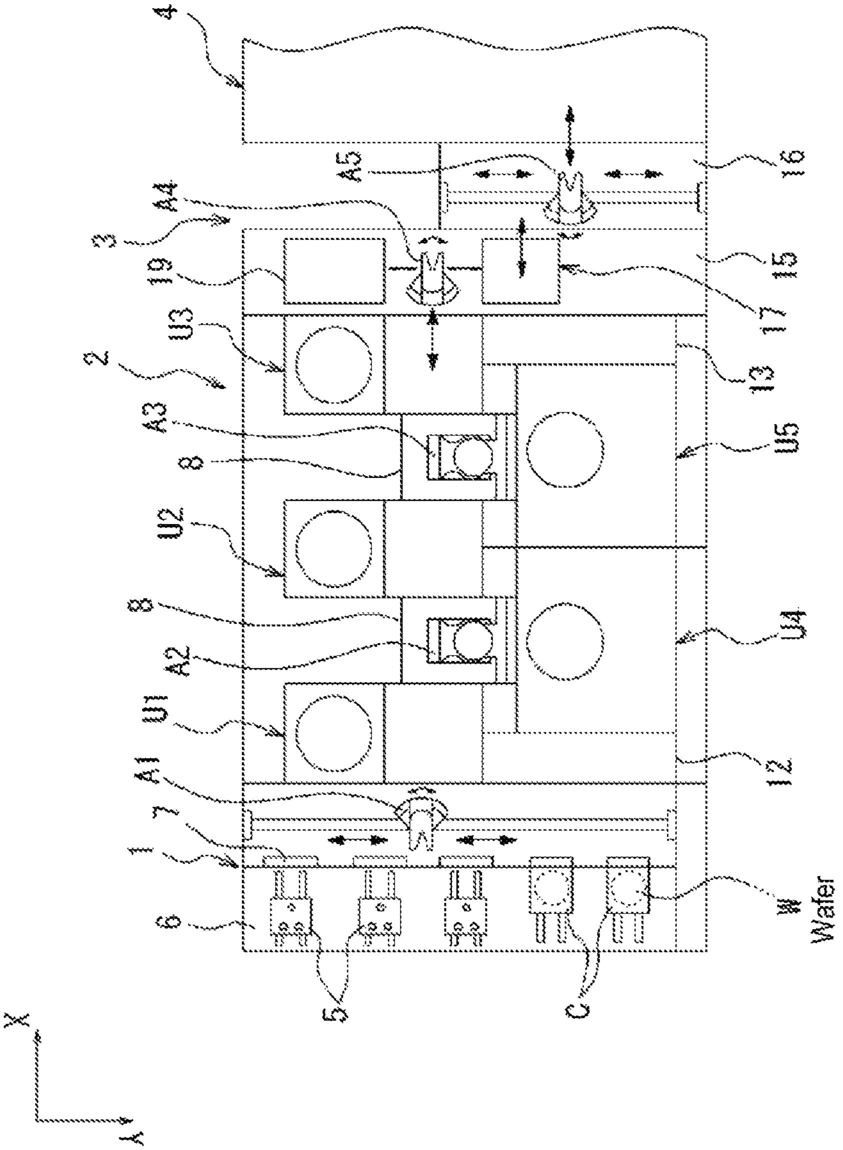
FIG. 2 is a schematic plane view of the resist coating/developing system 200 shown in FIG. 1.

As shown in FIGS. 1 and 2, a resist coating/developing system 200 includes a loading/unloading section 1 configured to load/unload each cassette CB which receives a plurality of wafers W, a processing section 2 configured to pick up the wafers W from the cassette CB of the loading/unloading section 1 and perform a resist coating/developing treatment on the picked-up wafers W, and an exposing section 4 connected to the processing section 2 through an interface section 3.

The loading/unloading section 1 includes a cassette station 6 having mounting tables 5 on each of which the cassette CB which air-tightly receives the plurality of (e.g., twenty five) wafers W therein is mounted, a plurality of shutters 7 disposed at a wall surface of the cassette station 6 side, and a transfer part A1 which picks up the wafers W from the cassette CB via the shutter 7.

In the processing section 2 includes shelf units U1, U2 and U3, which are multi-staged units of a heating/cooling system and are sequentially arranged from the left front side when viewed from the loading/unloading section 1, and main transfer mechanisms A2 and A3 configured to transfer the wafers W between processing units including a coating/developing unit (which will be described later), wherein the shelf units U1, U2 and U3, and the main transfer mechanisms A2 and A3 are alternately arranged. Specifically, the shelf units U1, U2 and U3 and the main transfer mechanisms A2 and A3 are arranged forward and backward in a row when reviewed from the loading/unloading section 1. Openings (not shown) through which the wafers W are transferred are formed at respective connection portions between each of the shelf units U1, U2 and U3 and each of the main transfer mechanisms A2 and A3 such that the wafers W can be freely moved from the shelf unit U1 positioned at one end to the shelf unit U3 positioned at another end. In addition, the main transfer mechanisms A2 and A3 are disposed within spaces that are defined by partition walls 8, respectively, each of the partition wall 8 being formed by one side of each of the shelf units U1, U2 and U3 disposed forward and backward when viewed from the loading/unloading section 1, one side of each of solution processing units U4 and U5 (which will be described later) disposed at the right side when viewed from the loading/unloading section 1, and a rear side constituting a left side of the partition wall 8 when viewed from the loading/unloading section 1. In FIG. 2, numerical references 12 and 13 represent temperature/humidity control units, respectively, each being equipped with a thermostat of a process solution used in each unit, a temperature/humidity control duct and the like, respectively.

For example, as shown in FIG. 1, each of the solution processing units U4 and U5 is constituted by a plurality of (e.g., five) stacked units including a coating unit COT, a developing unit DEV having a developing device, an anti-reflection film forming unit BARC and the like, which are disposed on reception parts 14 constituting a space from which a liquid chemical such as a coat solution (resist solution), developer, or the like, are supplied. Further, each of the shelf units U1, U2 and U3 is constituted by a plurality of (e.g., ten) stacked units including various units configured to perform a pre-process and a post-process of a process to be performed in the solution processing units U4 and U5, a combination of which includes a heating unit for heating (or baking) the wafer W, a cooling unit for cooling the wafer W, etc.

Figure 3:
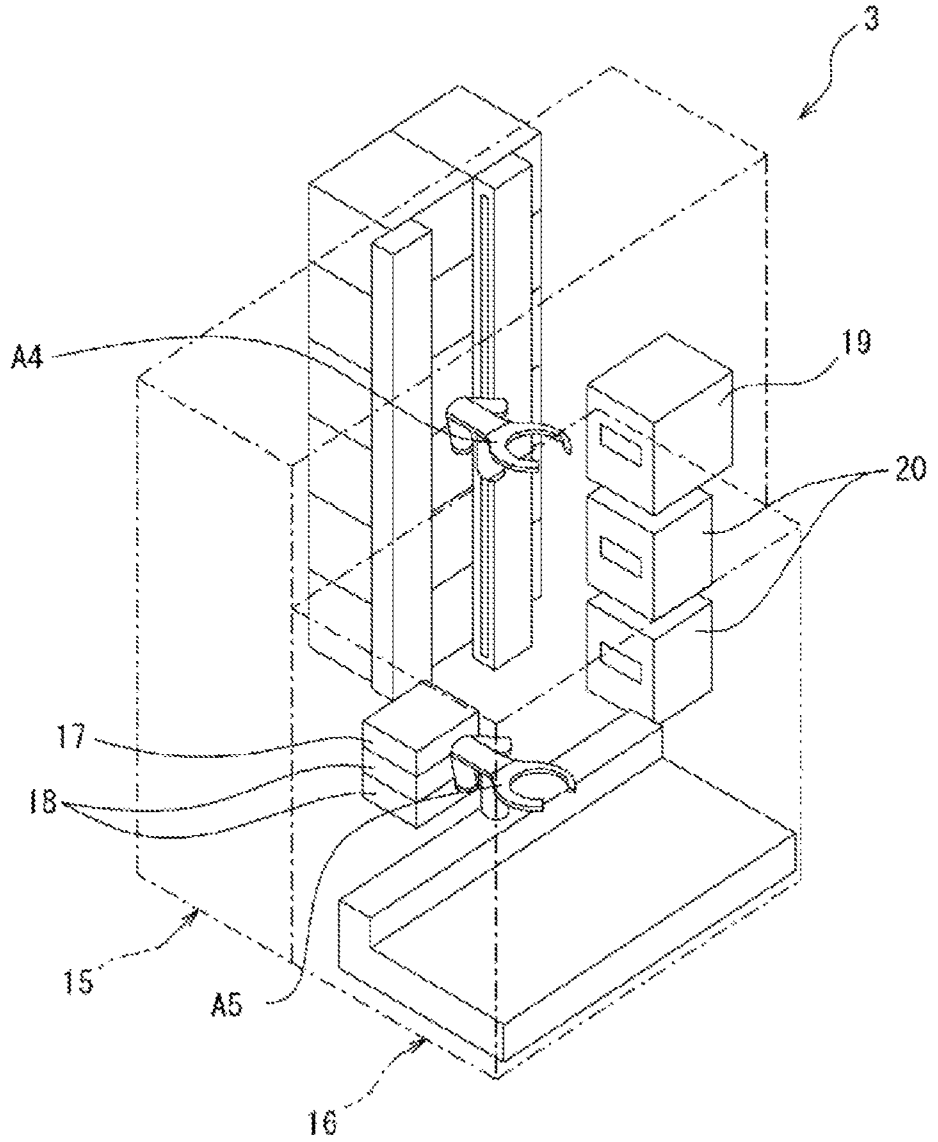
FIG. 3 is a schematic perspective view of an interface section provided in the resist coating/developing system.

The exposing section 4 is connected to an inner side of the shelf unit U3 in the processing section 2 through the interface section 3. The interface section 3 includes a first transfer chamber 15 and a second transfer chamber 16 which are interposed forward and backward between the processing section 2 and the exposing section 4. Each of the first and second transfer chambers 15 and 16 is surrounded by, e.g., a housing. As shown in FIG. 3, a transfer mechanism A4, which is capable of vertically moving, rotating around a perpendicular axis and displacing, is disposed at the center of the first transfer chamber 15. The transfer mechanism A4 is configured to have an access to a transition unit (TRS) 17, a high-precision temperature control unit 18, a peripheral exposure unit 19 including a peripheral exposure apparatus 30 according to the present disclosure, a buffer cassette 20, and the shelf unit U3 disposed in the processing section 2 such that the wafers W can be delivered between the respective units.

The following is a description of an illustrative flow of the wafer which is processed in the resist coating/developing system 200 configured as above. First, when the cassette CB accommodating the wafers W are mounted on the mounting table 5 of the loading/unloading section 1 from outside, the shutter 7 and a cover of the cassette CB are opened, and subsequently, the wafer W is picked up by the transfer part A1. Then, the picked-up wafer W is transferred to the main transfer mechanism A2 via a transition unit (not shown) constituting one stage of the shelf unit U1. Thereafter, as a pre-process of a coating process to be performed in one of the shelf units U1 to U3, for example, an anti-reflection film formation process and a cooling process are performed on the wafer W, followed by a process of coating a resist solution on the wafer W in the coating unit COT. Subsequently, the wafer W is heated (baked) by the heating unit constituting one shelf of the shelf units U1, U2 and U3, and then cooled. The cooled wafer W is carried in the interface section 3 through a transition unit of the shelf unit U3. The wafer W carried in the interface section 3 is transferred into the first transfer chamber 15 by the transfer mechanism A4 and is further transferred to the peripheral exposure unit 19 where the wafer W is subjected to a peripheral exposure treatment as described later. The wafer W which has been subjected to peripheral exposure treatment, is transferred to the high-precision temperature control unit 18 by the transfer mechanism A4, a temperature of a surface of the wafer W is adjusted to a set temperature corresponding to a temperature of the interior of the exposing section 4 with a high degree of accuracy. The transfer mechanism A4 transfers the temperature-adjusted wafer W to a transfer mechanism A5 via the transition unit 17 such that the wafer W is carried in the second transfer chamber 16. Thereafter, the wafer W is transferred to the exposing section 4 by the transfer mechanism A5 where the wafer W is subjected to the exposure treatment. After the exposure treatment, the wafer W is transferred to the main transfer mechanism A3 along a reverse path of the flow as described above, and subsequently, the wafer W is subjected to a development treatment in the developing unit DEV where an unnecessary resist is removed by a developer. Thereafter, the wafer W is heated (post-baked) by the heating unit constituting one shelf of the shelf units U1, U2 and U3, and then cooled by the cooling unit. Subsequently, the wafer W is returned to and received in the original cassette CB mounted on the mounting table 5 of the loading/unloading section 1.

First Embodiment

Now, the peripheral exposure apparatus 30 according to the present disclosure will be described.

Figure 4A:
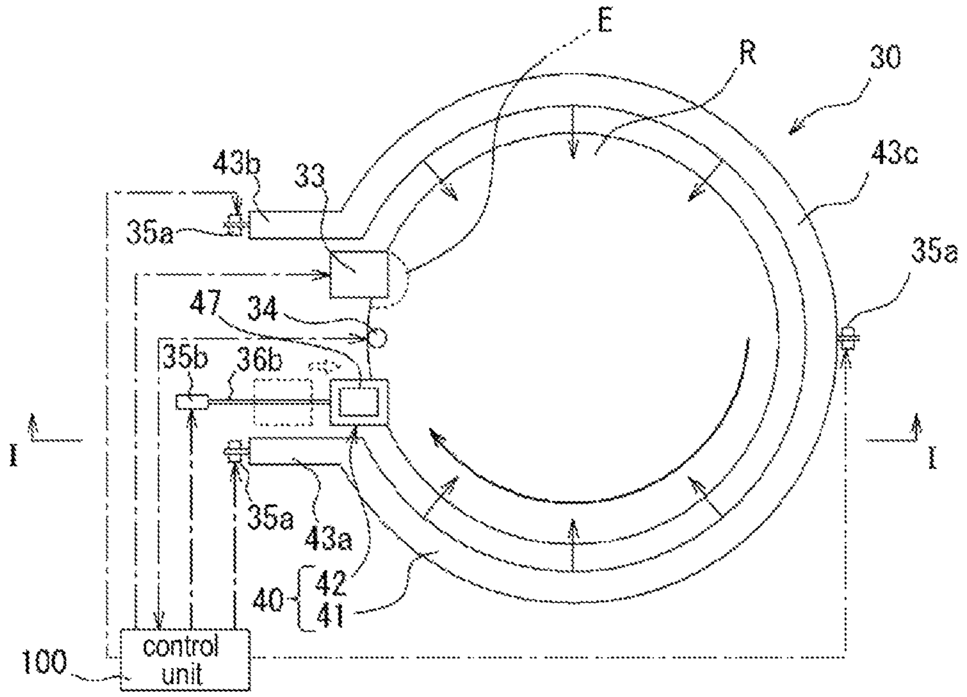
FIG. 4A is a schematic plane view of a peripheral exposure apparatus according to one embodiment of the present disclosure.
Figure 4B:
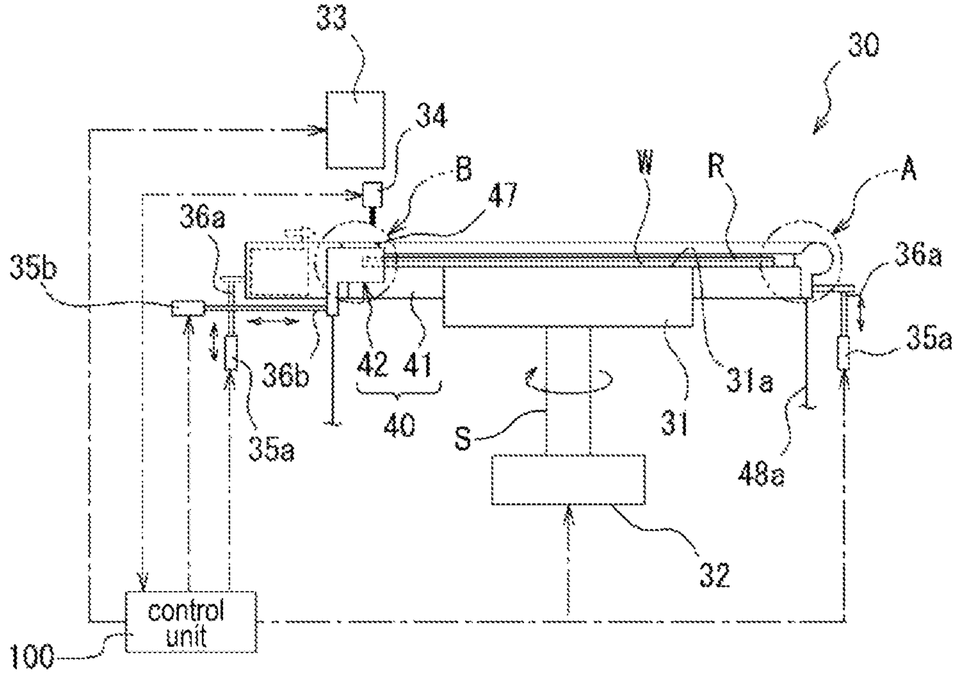
FIG. 4B is a schematic cross sectional view taken along in line I-I in FIG. 4A.

As shown in FIGS. 4A and 4B, the peripheral exposure apparatus 30 is incorporated into the peripheral exposure unit 19 of the interface section 3, as described above. The peripheral exposure apparatus 30 includes a spin chuck 31, as a substrate holder, configured to horizontally hold the wafer W on which a resist film R is coated, a motor 32, as a driving part, configured to rotate the spin chuck 31, a light source unit 33 having a light source configured to illuminate light with respect to an exposure region E of the wafer W, a temperature sensor 34, as a temperature measurement unit, configured to measure a temperature of the wafer W, a cooler 40 configured to cool the wafer W by bringing a coolant gas into contact with a periphery of the resist film R of the wafer W, cylinders **35*a* and 35*b*, as a moving mechanism, configured to move the cooler 40 to a position in the vicinity of the upper surface of the wafer W and a standby position, and a control unit 100** configured to control the aforementioned respective units.

Herein, the position in the vicinity of the upper surface represents a position closer to the upper surface of the wafer W which is absorbed on a wafer adsorption surface **31*a* of the spin chuck 31. The standby position represents a position spaced apart from the spin chuck 31, which will not cause any interference when the wafer W is loaded to or unloaded from the spin chuck 31**.

The spin chuck 31 rotates around a vertical shaft S by the motor 32. Although a rotational direction of the spin chuck 31 may be any one of clockwise and counterclockwise, in this embodiment, it will be described as the clockwise rotation. Vacuum exhaust holes (not shown) are formed on the upper surface of the spin chuck 31. The vacuum exhaust holes are connected to a vacuuming device (not shown). Vacuuming by the vacuum exhaust hole allows the wafer W to be absorbed on the wafer adsorption surface **31*a* of the spin chuck 31**.

Figure 5A:
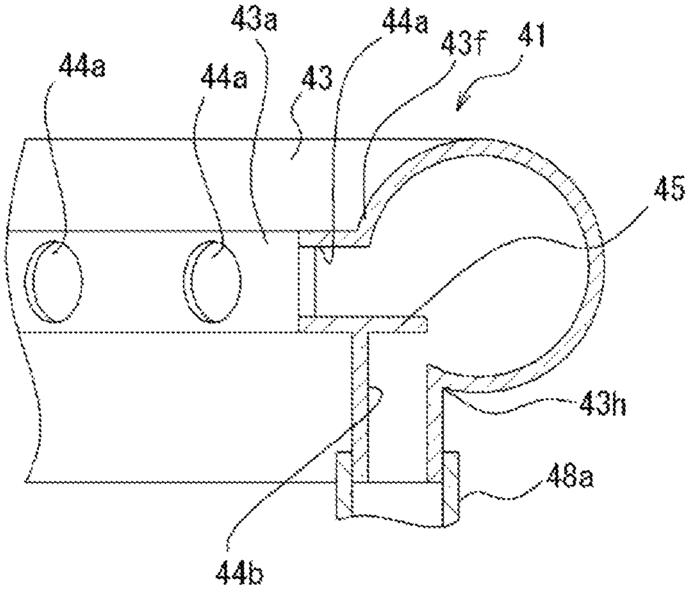
FIG. 5A is an expanded sectional view of a portion A in FIG. 4B.
Figure 5B:
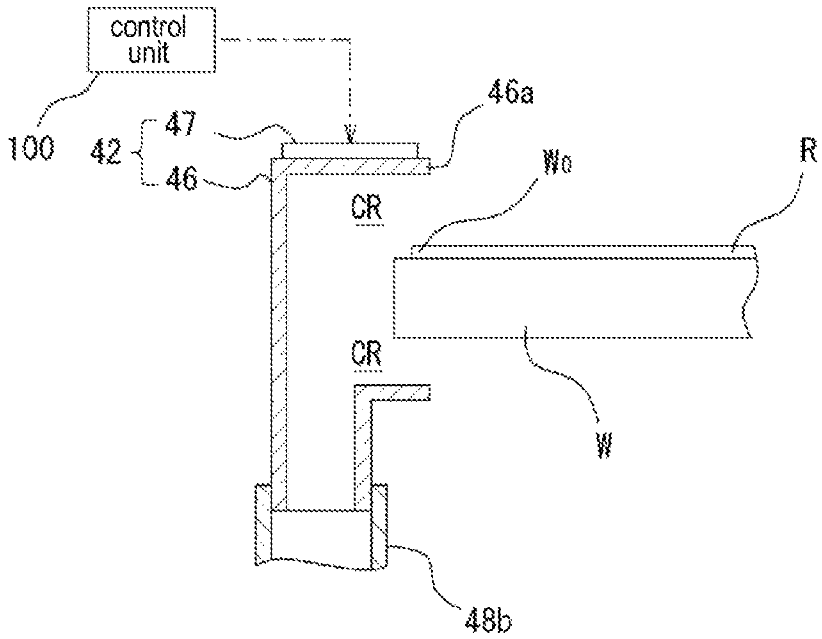
FIG. 5B is an expanded sectional view of a portion B in FIG. 4B.

In the following, a configuration of the cooler 40 will be described with reference to FIGS. 4A to 6C. For the sake of clarity, the wafer W is not shown in FIG. 5A. FIG. 5A is an expanded sectional view of a portion A in FIG. 4B, and FIG. 5B is an expanded sectional view of a portion B in FIG. 4B.

The cooler 40 includes a first cooler 41 which is formed in a substantially ring shape with respect to an outer peripheral portion Wo excluding the exposure region E of the periphery of the resist film R of the wafer W that is absorbed on the wafer adsorption surface 31*a* of the spin chuck 31, and a second cooler 42 which is disposed at the upstream side of the exposure region E of the periphery of the resist film R of the wafer W in the rotational direction of the spin chuck 31.

The first cooler 41 includes a hollow cooler body 43 disposed at the outer peripheral portion Wo of the periphery of the spin chuck 31, and discharge holes 44*a* formed to be spaced apart by a certain distance in an inner peripheral portion 43*f* of the cooler body 43. In this case, a diameter of the discharge hole 44*a* is set to two times (i.e., 2 mm) of a thickness (1 mm) of the wafer W. Further, a bypass plate 45 for bypassing the coolant gas is formed within the cooler body 43.

In a state that the wafer W is held by the spin chuck 31, the cooler body 43 is formed in a hollow arc-shaped to surround (enclose) an outer periphery excluding the exposure region E of the wafer W, and is formed to block both end portions 43*a* and 43*b* of a flow path through which the coolant gas is flown and formed by the hollow structure. Further, a region (shown in the left side in FIG. 4A) formed between both the end portions 43*a* and 43*b* of the cooler body 43 is opened.

Figure 6A:
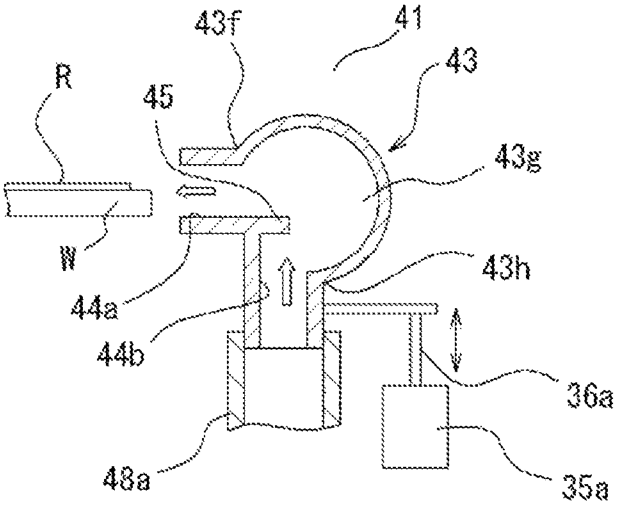
FIG. 6A to 6C are schematic sectional views showing a cooler body of a first cooler having various shapes, according to another embodiment of the present disclosure, respectively.

A description of an internal configuration of the first cooler 41 will be described in detail with reference to FIGS. 6A to 6C. The cooler body 43 of the first cooler 41 is formed in a substantially hollow ring shape to exclude the exposure region E. A vertical cross section of the wafer adsorption surface 31*a* of the cooler body 43 is formed in a circle shape. Further, the plurality of discharge holes 44*a* are formed in the inner peripheral portion 43*f* of the cooler body 43 at regular intervals. A leading end of each of the discharge holes 44*a* faces a side surface of the wafer W absorbed on the wafer adsorption surface 31*a* of the spin chuck 31 and above the resist film R. A supply hole 44*b* connected to a first supply line 48*a* is formed in a lower portion 43*h* of other end portion 43*c* facing the exposure region E in the cooler body 43.

The supply hole 44*b* has a lower end portion connected to the first supply line 48*a*. A bypass plate 45 for bypassing the coolant gas is formed in a leading end portion of the flow path of the cooler body 43. With this configuration, the coolant gas, which is supplied from a first gas supply source 49*a* (see FIG. 7) and is flown into the supply hole 44*b*, flows along an inner wall 43*g* of the cooler body 43 by means of the bypass plate 45. The coolant gas flown along the inner wall 43*g* is discharged from the discharge holes 44*a* so that it is brought into contact with the side wall of the wafer W and above the resist film R.

With the configuration as described above, since the coolant gas supplied from the first gas supply source 49*a* is bypassed by the bypass plate 45 and is moved along the inner wall 43*g* of the cooler body 43, and subsequently, is discharged from the discharge hole 44*a*, it is possible to prevent the coolant gas discharged from the discharge hole 44*a* from being pulsated.

Figure 6B:
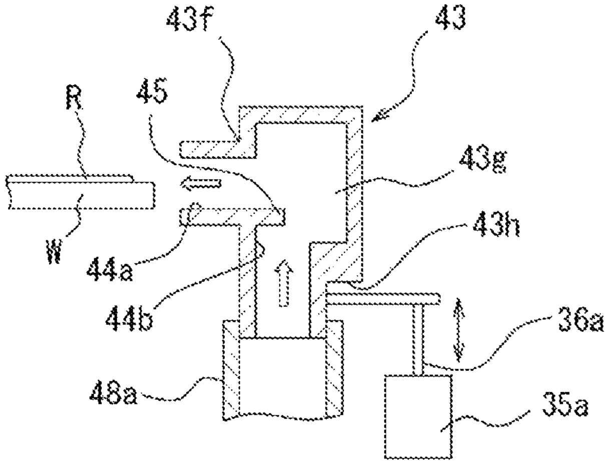
Figure 6C:
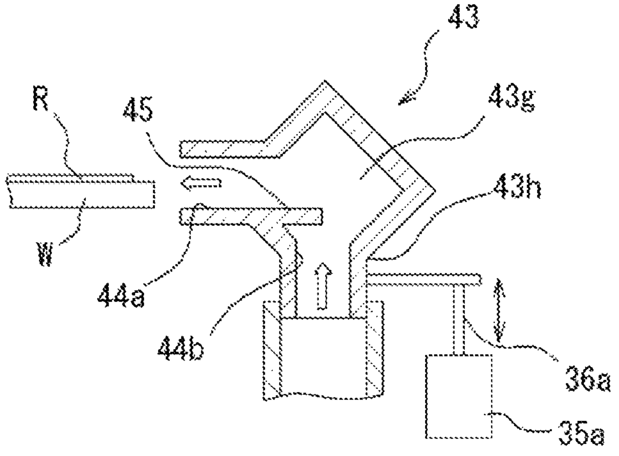

In some embodiments, as shown in FIGS. 6B and 6C, the vertical cross section of the wafer adsorption surface 31*a* of the cooler body 43 may be a rectangular shape or a rhomboidal shape. Such a shape prevents the pulsation of the coolant gas discharged from the discharge hole 44*a*.

Further, while in the above embodiment, the supply hole 44*b* has been described to be formed at the other end portion 43*c* of the cooler body 43, the supply hole 44*b* may be formed at the end portion 43*a* of the cooler body 43. In this case, since the supply hole 44*b* is spaced apart from the discharge holes 44*a* at a certain distance, it is possible to prevent the pulsation of the coolant gas discharged from the discharge holes 44*a* without the bypass plate 45.

Figure 7:
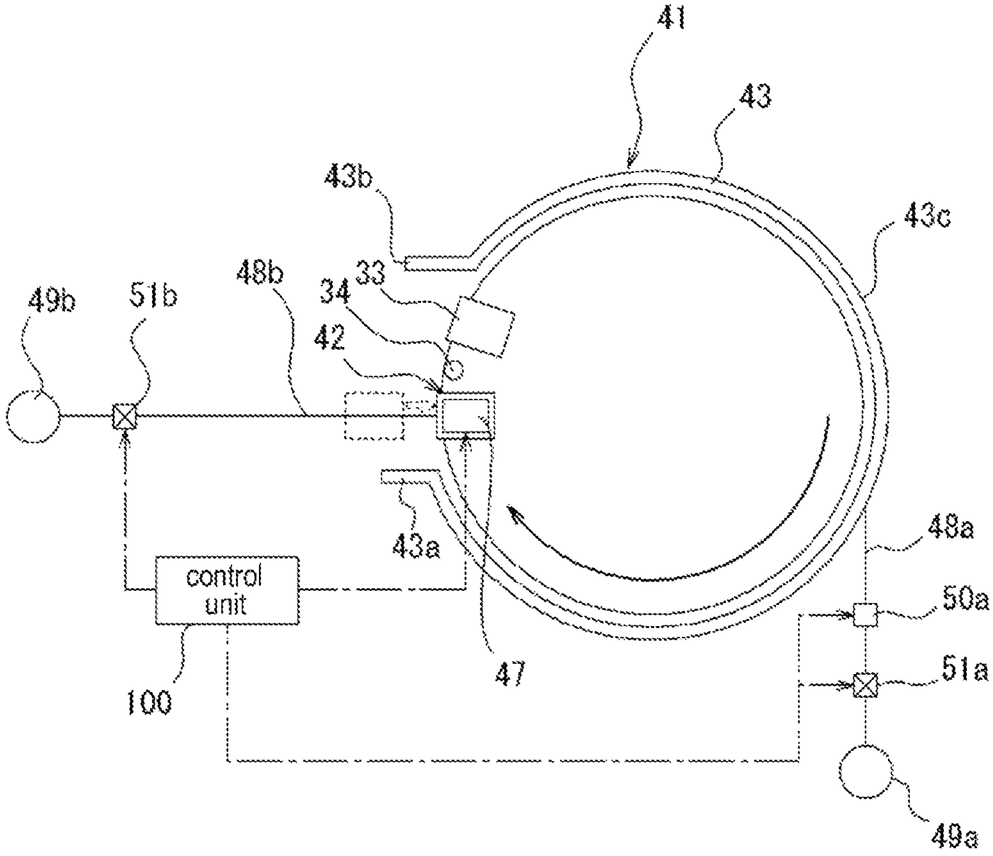
FIG. 7 is a schematic plane view of a cooler according to one embodiment.

The first gas supply source 49*a* is connected to the supply hole 44*b* of the other end portion 43*c* of the cooler body 43 through the first supply line 48*a*. As shown in FIG. 7, an opening/closing valve 51*a* which is capable of controlling a flow rate and a first temperature controller 50*a* are sequentially disposed in the first supply line 48*a* from the first gas supply source 49*a* side. In this case, the first gas supply source 49*a* is configured to supply, e.g., any one of a dry air, a nitrogen (N2) gas and a helium (He) gas. The first temperature controller 50*a* is configured to control air supplied from the first gas supply source 49*a* to room temperature which will not influence an atmosphere temperature of a peripheral exposure portion, for example, a temperature in the range of 20 to 25 degrees C.

The second cooler 42 includes a cooling body 46 which covers a side portion and upper and lower portions of the periphery of the wafer W that is absorbed on the wafer adsorption surface 31*a* of the spin chuck 31 with a clearance CR left therebetween, and a cooling element 47 which contacts with a upper member 46*a* of the cooling body 46 to cool the air to the predetermined temperature or less. In one embodiment, the cooling element 47 may be formed of a Peltier element. The cooling element 47 is electrically connected to the control unit 100 and is controlled to a temperature in the range of 15 to 20 degrees C. based on a control signal provided from the control unit 100. The cooling body 46 is connected to a second gas supply source 49*b* through a second supply line 48*b*. As shown in FIG. 7, an opening/closing valve 51*b* which is capable of controlling a flow rate is disposed in the second supply line 48*b*. In one embodiment, the second gas supply source 49*b* is configured to supply, e.g., any one of a dry air, a nitrogen (N2) gas and a helium (He) gas. The cooling element 47 is configured to cool the gas supplied from the second gas supply source 49*b* to, e.g., a temperature in the range of 20 to 25 degrees C.

Further, the cooler body 43 of the first cooler 41 is configured to be movable by the cylinder 35*a* as a first cooler moving mechanism. In some embodiments, as shown in FIGS. 4A and 4B, the cylinder 35*a* is installed in the vicinity of both the end portions 43*a* and 43*b* of the arc-shaped cooler body 43, and in the vicinity of the other end portion 43*c* having an arc-shaped. During the course of the peripheral exposure treatment, a rod 36*a* of the cylinder 35*a* moves upward such that the cooler body 43 moves to the position in the vicinity of the upper surface of the wafer W. During the course of the loading/unloading of the wafer W, the rod 36*a* of the cylinder 35*a* moves downward such that the cooler body 43 moves below the wafer adsorption surface 31*a* of the spin chuck 31.

As shown in FIGS. 4A and 4B, the cylinder 35*b* as a second cooler moving mechanism configured to horizontally move the cooling body 46 is installed in the cooling body 46 of the second cooler 42. During the course of the peripheral exposure treatment, a rod 36*b* of the cylinder 35*b* moves in a direction near horizontally to the spin chuck 31 such that the cooling body 46 moves to the position in the vicinity of the upper surface of the wafer W. During the course of the loading/unloading of the wafer W, the rod 36*b* of the cylinder 35*b* moves in a direction apart horizontally from the spin chuck 31 such that the cooling body 46 moves to the standby position while being separated from the spin chuck 31.

The temperature sensor 34 is disposed above the spin chuck 31. The temperature sensor 34 is configured to move upward and downward based on the control signal provided from the control unit 100 (which will be described later), detect temperature of the peripheral portion of the wafer W and send the detected temperature signal to the control unit 100. During the course of the peripheral exposure treatment, the temperature sensor 34 moves downward such that the temperature sensor 34 is at a position spaced apart by a predetermined distance from the wafer W absorbed on the wafer adsorption surface 31*a* of the spin chuck 31. During the course of the loading/unloading of the wafer W, the temperature sensor 34 moves upward such that it is separated from the spin chuck 31.

Although a position of the temperature sensor 34 may be the downstream side of the exposure region E in the rotational direction of the spin chuck 31, the position may be preferably set to the upstream side of the exposure region E and the downstream side of the second cooler 42. This setting is to accurately measure the temperature of the wafer W before the peripheral exposure treatment.

As described above, during the course of the loading/unloading of the wafer W, the cooler body 43 of the first cooler 41 moves to downside of the spin chuck 31, the cooling body 46 of the second cooler 42 moves in the direction apart horizontally from the spin chuck 31, and the temperature sensor 34 moves upward to be separated from the spin chuck 31, which makes it possible to form a space in which the wafer W is loaded on/unloaded from the wafer adsorption surface 31*a* of the spin chuck 31.

The light source unit 33 includes the light source configured to expose the resist film R of the exposure region E of the wafer W and is disposed above an end portion of the wafer W absorbed on the wafer adsorption surface 31*a* of the spin chuck 31. For example, an ultrahigh pressure mercury lamp, a Xenon flash lamp or the like, may be used as the light source of the light source unit 33.

The control unit 100 is electrically connected to the motor 32, the light source unit 33, the temperature sensor 34, the cylinders 35*a* and 35*b*, the first temperature controller 50*a* and the cooling element 47 to control them. The number of rotations of the spin chuck 31 is controlled based on a control signal provided from the control unit 100 to the motor 32. The light source unit 33 performs an exposure on the exposure region E based on a control signal provided from the control unit 100. The temperature sensor 34 sends the measured temperature signal to the control unit 100. Each of the cylinders 35*a* and 35*b* vertically and horizontally move the rods 36*a* and 36*b* based on a signal provided from the control unit 100 such that the cooler body 43 of the first cooler 41 and the cooling body 46 of the second cooler 42 are moved to the position in the vicinity of the upper surface of the wafer W and the standby position spaced apart from the wafer W, respectively. The first temperature controller 50*a* cools the gas supplied from the first gas supply source 49*a* to room temperature, e.g., 20 to 25 degrees C., based on a signal provided from the control unit 100. The cooling element 47 cools the gas supplied from the second gas supply source 49*b* to, e.g., 15 to 20 degrees C., based on a signal provided from the control unit 100.

<First Peripheral Exposure Method>

Figure 8:
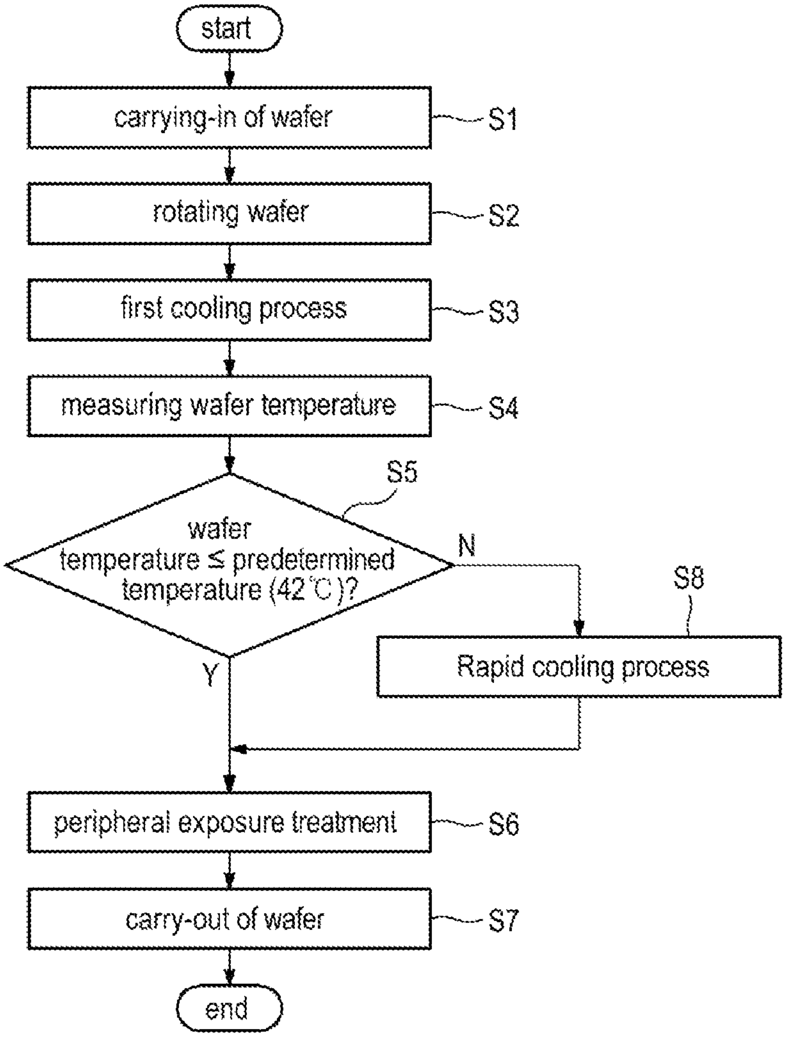
FIG. 8 is a flow chart showing main operations of a first peripheral exposure method according to one embodiment.

Next, a first peripheral exposure method according to another embodiment of the present disclosure will be described. FIG. 8 is a flowchart illustrating the first peripheral exposure method.

The wafer W carried in the interface section 3 is transferred to the peripheral exposure apparatus 30 incorporated into the peripheral exposure unit 19 by the transfer mechanism A4 (Operation S1). In this time, the first cooler 41 and the second cooler 42 are moved to the standby position by the cylinders 35*a* and 35*b*, respectively. The temperature sensor 34 moves upward to be spaced apart from the spin chuck 31.

The wafer W transferred to the peripheral exposure apparatus 30 is absorbed on the wafer adsorption surface 31*a* of the spin chuck 31. The wafer W absorbed on the wafer adsorption surface 31*a* rotates at, e.g., 6 rpm to 60 rpm, by a rotational driving of the motor 32 (Operation S2). At this time, the rod 36*a* of the cylinder 35*a* moves upward such that the cooler body 43 of the first cooler 41 moves to a position of a portion which surrounds the outer peripheral portion Wo of the resist film R of the wafer W, which is the position in the vicinity of the upper surface of the wafer W. The rod 36*b* of the cylinder 35*b* moves in a direction near horizontally to the spin chuck 31 so that the cooling body 46 of the second cooler 42 moves to the position in the vicinity of the upper surface of the wafer W. The operation S2 corresponds to a rotation process of the present disclosure.

The coolant gas, e.g., the dry air, which is cooled to, e.g., 23 degrees C. by the first temperature controller 50*a*, is supplied (or discharged) from the first cooler 41 which is moved to the position of the portion which surrounds the outer peripheral portion Wo of the resist film R of the wafer W so that the coolant gas is brought into contact with the periphery of the outer peripheral portion Wo excluding the exposure region E of the resist film R (Operation S3). This operation S3 corresponds to a first cooling process of the present disclosure. While in this embodiment, the dray air has been described to be used as the coolant gas, nitrogen (N2) gas and helium (He) gas may be used. Among them, the helium gas having a high thermal conductivity may be preferably used as the coolant gas. Further, in this embodiment, the temperature of the coolant gas is set to 23 degrees C. and a flow rate of the coolant gas is set to 10 L to 20 L per minute.

As described hereinafter, when the resist film R is subjected to the peripheral exposure treatment at a high temperature higher than 42 degrees C., a resist droop with a size of a predetermined value (e.g., 100 μm) or more is generated. This requires setting the temperature of the coolant gas of the wafer W to 42 degrees C. or less. Accordingly, when the resist film R is cooled at the first cooling process, it is preferable to set the temperature of the coolant gas supplied (discharged) from the first cooler 41 to a temperature in the range of 20 to 25 degrees C. Such a temperature setting allows the peripheral exposure without interfering with an atmosphere temperature of the peripheral exposure apparatus 30.

During the first cooling process or after the first cooling process in the operation S3, the temperature sensor 34 measures the temperature of the wafer W to determine whether or not the temperature of the wafer W is equal to or less than a predetermined temperature T1 (Operations S4 and S5). In this embodiment, the predetermined temperature T1 used in the determination operation is set to 42 degrees C.

If the temperature of the wafer W is determined to be equal to or less than the predetermined temperature T1 in the operation S5, the light source of the light source unit 33 illuminates light to the resist film R of the exposure region E of the wafer W to perform the peripheral exposure treatment (Operation S6). Upon completion of the peripheral exposure treatment, the wafer W is carried out of the peripheral exposure apparatus 30 (Operation S7), and control is terminated.

Meanwhile, if in the operation S5 the temperature of the wafer W is determined to be not equal to or less than the predetermined temperature T1, the coolant gas is supplied (discharged) from the first cooler 41 and the second cooler 42 so that the coolant gas is brought into contact with the periphery of the outer peripheral portion Wo excluding the exposure region E of the wafer W (Operation S8). This operation S8 corresponds to a rapid cooling operation of the present disclosure. While in this embodiment, the dray air has been described to be used as the coolant gas supplied from the second gas supply source 49*b*, a nitrogen (N2) gas and a helium (He) gas may be used. Among them, the helium gas having a high thermal conductivity may be preferably used as the coolant gas.

In this embodiment, the temperature of the coolant gas, which is discharged from the cooler body 43 of the first cooler 41 to the resist film R in the vicinity of the wafer W, is set to 23 degrees C., and a flow rate of the coolant gas is set to 10 L to 20 L per minute. Further, the temperature of the coolant gas, which is discharged from the cooling body 46 of the second cooler 42 to the resist film R in the vicinity of the wafer W, is set to 20 degrees C., and a flow rate of the coolant gas is set to 1 L to 5 L per minute. In the rapid cooling process, in view of the reason similar to the first cooling process, the temperature of the coolant gas which is discharged from the first cooler 41 is preferably set to 20 to 25 degrees C., and the temperature of the coolant gas which is discharged from the second cooler 42 is preferably set to 15 to 20 degrees C.

As described above, according to the first peripheral exposure method as shown in the operations S1 to S8, since the coolant gas discharged from the first cooler 41 is brought into contact with the periphery of the resist film R in the first cooling process, it is possible to set the temperature of the resist film R to the predetermined temperature T1 or less in a relatively short period of time. Further, after the first cooling process, if the temperature of the wafer W is determined to be not equal to or less than the predetermined temperature T1, the wafer W is cooled by the coolant gas discharged from the first cooler 41 and the second cooler 42 in the rapid cooling process, which makes it possible to accurately remove a surplus resist when removing the resist film R after the peripheral exposure treatment. Therefore, the cooling of the wafer W, which is to accurately remove the surplus resist (resist droop), can be performed in a relatively short period of time, which makes it possible to efficiently set the temperature of the resist film R to be subjected to the exposure treatment to be equal to or less than the predetermined temperature T1.

Further, the temperature of the coolant gas which is discharged from the first cooler 41 is set to 20 to 25 degrees C., and the temperature of the coolant gas which is discharged from the second cooler 42 is set to 15 to 20 degrees C. so that a width of the resist droop in the periphery of the resist film R can be controlled to 100 μm as the predetermined value.

<Second Peripheral Exposure Method>

Figure 9:
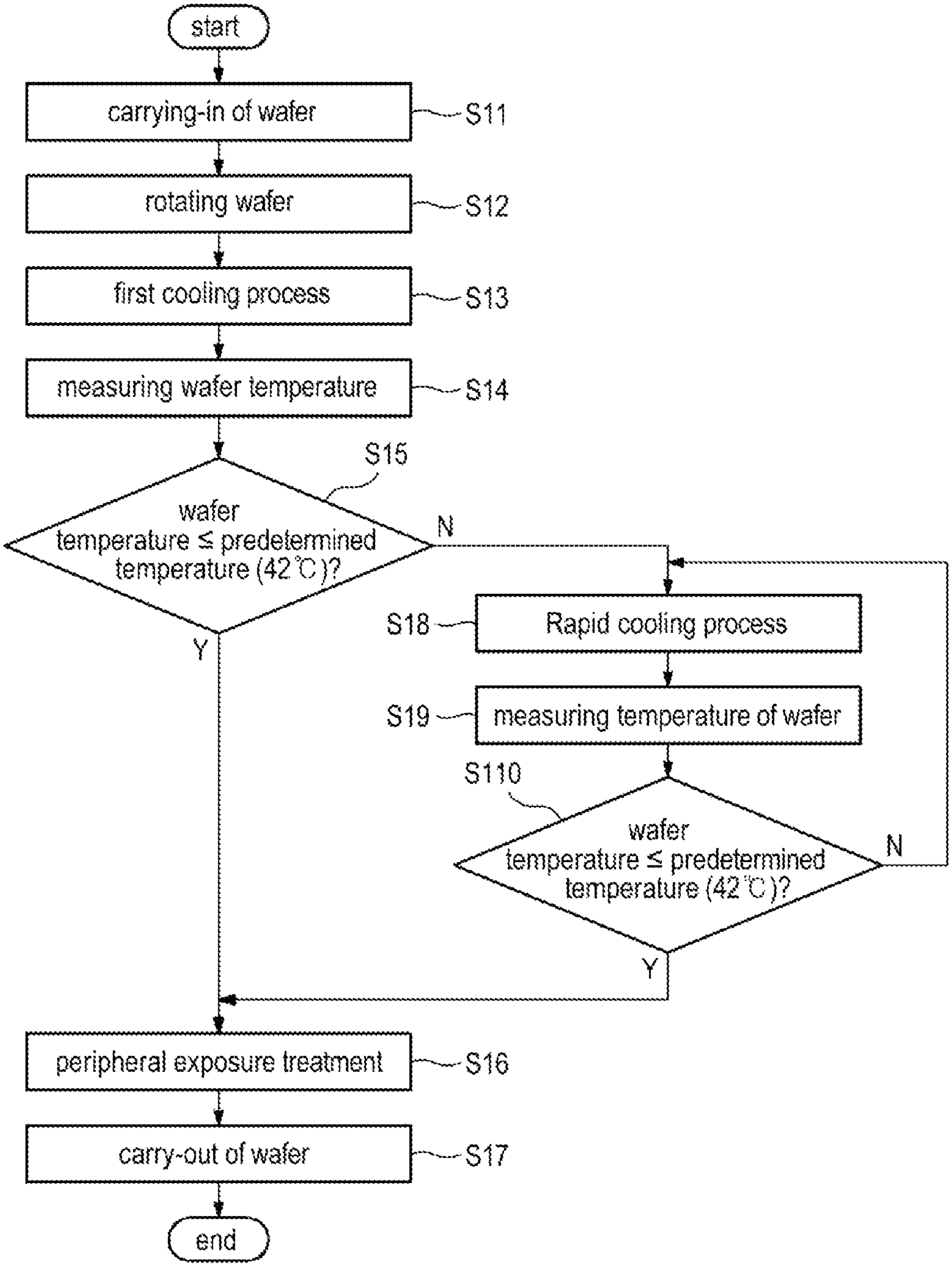
FIG. 9 is a flow chart showing main operations of a second peripheral exposure method according to another embodiment.

Next, a second peripheral exposure method according to another embodiment of the present disclosure will be described. FIG. 9 is a flowchart illustrating the second peripheral exposure method. The operations S1 to S8 shown in FIG. 8 and operations S11 to S18 shown in FIG. 9 are identical to each other, and, therefore a description thereof will be omitted to avoid duplication.

In operation S18, after the coolant gas is supplied (or discharged) from the first cooler 41 and the second cooler 42 and is brought into contact with the periphery of the outer peripheral portion Wo excluding the exposure region E of the wafer W, the temperature of the wafer W is measured by the temperature sensor 34 and it is determined whether the temperature of the wafer W is equal to or less than the predetermined temperature T1 (Operations S19 and S110). If the temperature of the wafer W is determined to be equal to or less than the predetermined temperature T1, since the resist film R has been sufficiently cooled so that the surplus resist can be accurately removed when removing the resist film R which has been subjected to the peripheral exposure treatment, the control process goes to the operation S16 where the peripheral exposure treatment is performed. Meanwhile, if the temperature of the wafer W is determined to be not equal to or less than the predetermined temperature T1, the control process returns to the operation S18 where the rapid cooling process is continued. That is, the rapid cooling process of the operation S18 is continued until the temperature of the wafer W becomes equal to or less than the predetermined temperature T1.

As described above, according to the second peripheral exposure method shown in the operations S11, even when the temperature of the wafer W is higher than the predetermined temperature T1 in the first cooling process, the rapid cooling process is continued until the temperature of the wafer W becomes equal to or less than the predetermined temperature T1, which makes it possible to control the cooling temperature of the wafer W, which is required to suppress the resist droop, with a high degree of accuracy.

Figure 10A:
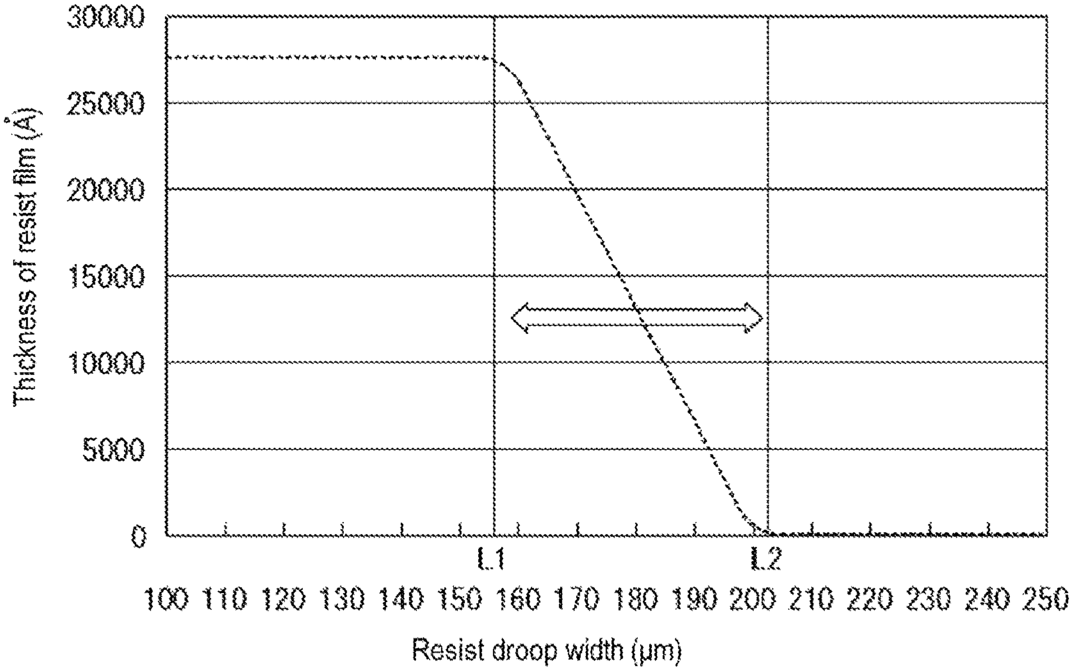
FIG. 10A is a graph showing the relationship between a resist droop width and a thickness of a resist film, which is coated on a wafer when removing the resist film that has been subjected to a peripheral exposure.
Figure 10B:
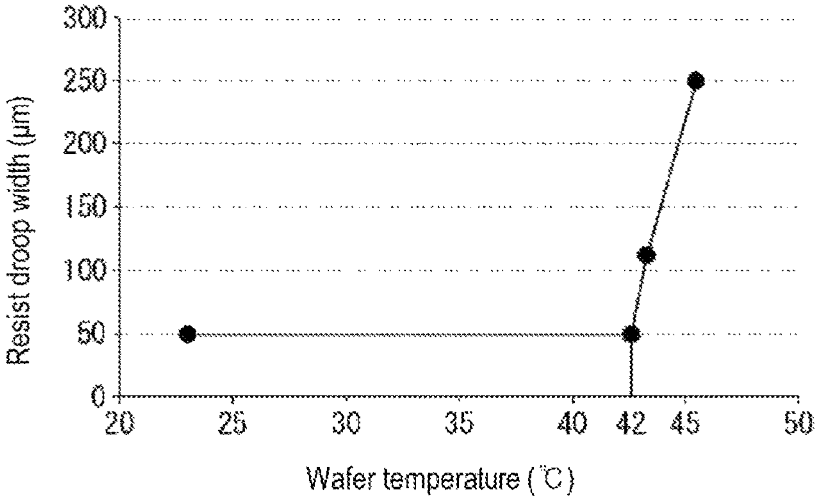
FIG. 10B is a graph showing the relationship between a width of a resist droop which is formed when removing the resist film after the peripheral exposure, and a wafer temperature during the peripheral exposure treatment.

FIGS. 10A and 10B are graphs showing the relationship between a width of the resist droop and the temperature of the wafer W, respectively. In FIGS. 10A and 10B, the resist droop represents that a cross section of the resist film R which is formed when being removed by the peripheral exposure is smoothly inclined and a horizontal length of the inclined cross section is represented as a "resist droop width".

First, one experiment was done to test the relationship between a thickness of the resist film R and the resist droop width depending on a temperature of the wafer W (hereinafter, referred to as "wafer temperature"). Herein, the wafer temperature is set to 42 degrees C. As a result, as shown in FIG. 10A, the thickness of the resist film R was 28,000 Å for the horizontal length L1 (about 155 μm), and the thickness of the resist film R was zero for the horizontal length L2 (about 205 μm). At this time, the resist droop width was about 50 μm.

Further, another experiment was done to test the relationship between the resist droop width and the wafer temperature. As shown in FIG. 10B, the test has shown that, when the wafer temperature is equal to or less than 42 degrees C., the resist droop width was about 50 μm, and when the wafer temperature becomes higher than 42 degrees C., the resist droop width was rapidly increased as the wafer temperature increases and was above 100 μm.

Therefore, in order to suppress the resist droop width to the predetermined value (100 μm), there is need to perform the peripheral exposure in a state where the wafer temperature is set to be equal to or less than 42 degrees C.

<Third Peripheral Exposure Method>

Figure 11:
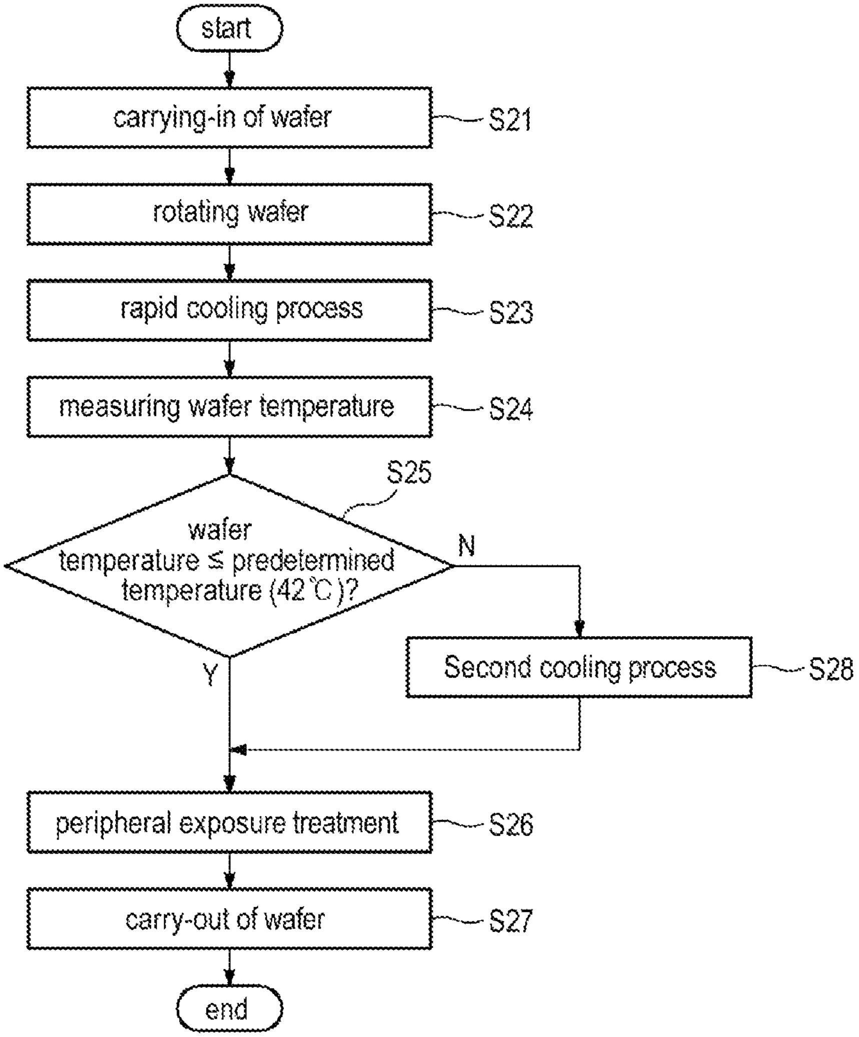
FIG. 11 is a flow chart showing main operations of a third peripheral exposure method according to another embodiment.

Next, a third peripheral exposure method according to another embodiment of the present disclosure will be described. FIG. 11 is a flowchart illustrating the third peripheral exposure method. The operations S1, S2, S4 to S7 shown in FIG. 8 and operations S21, S22, S24 to S27 shown in FIG. 11 are identical to each other, and, therefore a description thereof will be omitted to avoid duplication.

After the wafer W is rotated in operation S22, the rapid cooling process is performed in which the coolant gas is discharged from the first cooler 41 and the second cooler 42 to the periphery of the resist film R and is brought into contact with the periphery of the outer peripheral portion Wo excluding the exposure region E of the resist film R (Operation S23). Subsequently, in operation S25, if the wafer temperature is determined to be not equal to or less than the predetermined temperature T1, the control process goes to operation S28 where the second cooling process is performed. In the second cooling process, the coolant gas is discharged from the second cooler 42 to the periphery of the resist film R and is brought into contact with the periphery of the exposure region E of the resist film R at the upstream side in the rotational direction (Operation S28). After in the operation S28, the coolant gas is supplied from the second cooler 42 and the second cooling process is terminated, the control process goes to the operation S26 where the peripheral exposure treatment is performed.

In the second cooling process, the temperature of the coolant gas which is discharged from the cooling body 46 of the second cooler 42 to the resist film R in the vicinity of the wafer W is set to 20 degrees C., and a flow rate of the coolant gas is set to 1 L to 5 L per minute. Further, in the second cooling process, the temperature of the coolant gas which is discharged from the second cooler 42 is preferably set to 15 to 20 degrees C. in view of the reason similar to the first cooling process.

As described above, according to the third peripheral exposure method as shown in the operations S21 to S28, since the coolant gas discharged from the first cooler 41 and the second cooler 42 is brought into contact with the periphery of the resist film R in the rapid cooling process, it is possible to set the temperature of the resist film R to the predetermined temperature T1 or less in a relatively short period of time. Further, when the temperature of the wafer W after the rapid cooling process is not equal to or less than the predetermined temperature T1, since the wafer W is cooled by the coolant gas discharged from the second cooler 42, it is possible to suppress the resist droop when removing the resist film R which has been subjected to the peripheral exposure treatment. Therefore, the cooling of the wafer W, which is required to suppress the resist droop, can be performed in a relatively short period of time.

<Fourth Peripheral Exposure Method>

Figure 12:
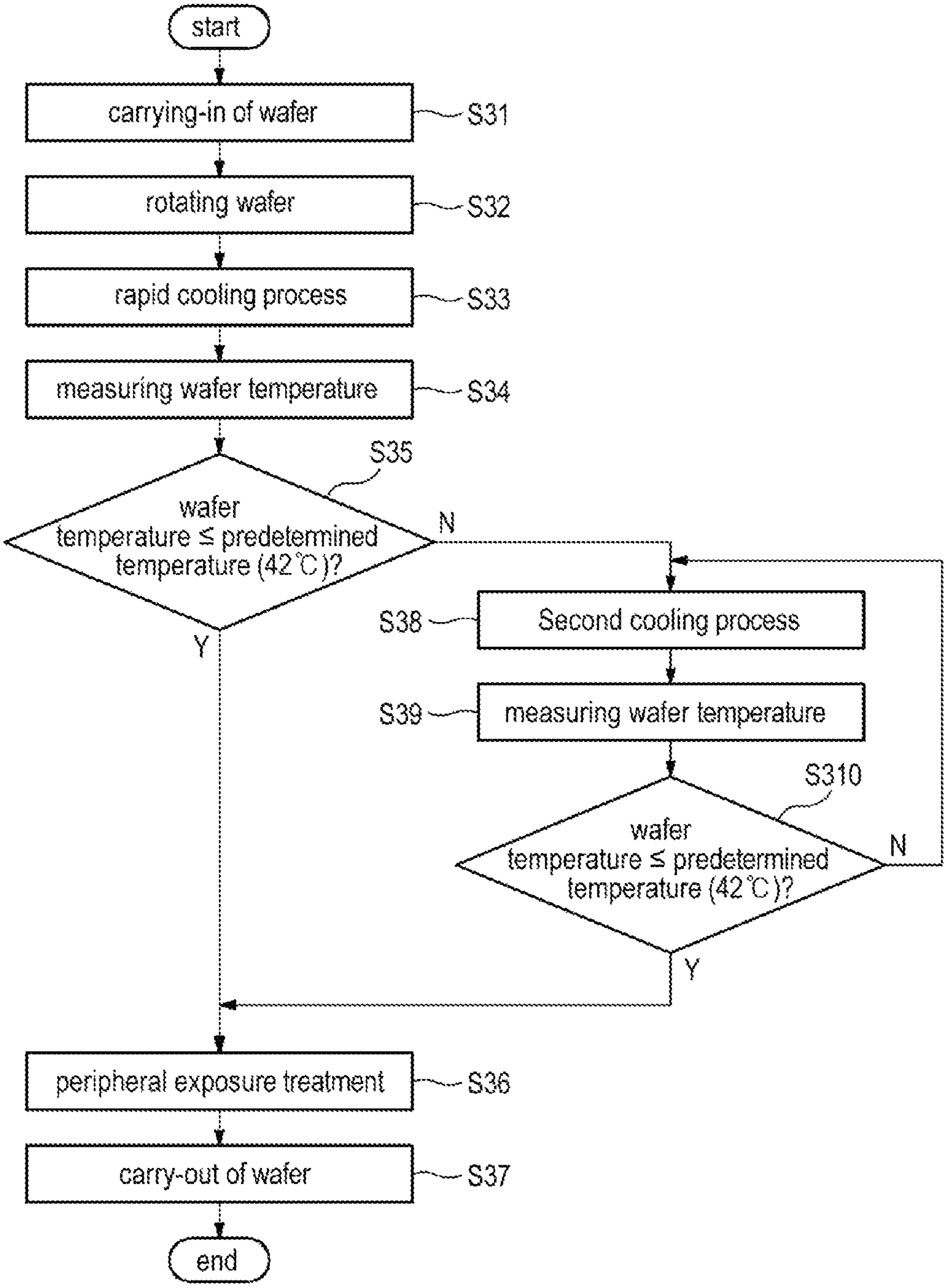
FIG. 12 is a flow chart showing main operations of a fourth peripheral exposure method according to another embodiment.

Next, a fourth peripheral exposure method according to another embodiment of the present disclosure will be described. FIG. 12 is a flowchart illustrating the fourth peripheral exposure method. The operations S21 to S28 in the flowchart shown in FIG. 11 and operations S31 to S38 in the flowchart shown in FIG. 12 are identical to each other, and, therefore a description thereof will be omitted to avoid duplication.

In operation S35, if the temperature of the wafer W which is cooled by performing the rapid cooling process using the first cooler 41 and the second cooler 42, is determined to be not equal to or less than the predetermined temperature T1, the control process proceeds to operation S38 where the second cooling process is performed. In the second cooling process of the operation S38, the coolant gas is discharged from the second cooler 42 to the periphery of the resist film R and is brought into contact with the periphery of the exposure region E of the resist film R at the upstream side in the rotational direction. During the second cooling process or after the second cooling process, the wafer temperature is measured by the temperature sensor 34 to determine whether or not the temperature of the wafer W is equal to or less than the predetermined temperature T1 (Operations S39 and S310). If the wafer temperature is determined to be equal to or less than the predetermined temperature Predetermined temperature T1 in the operation 310, since the resist droop after the peripheral exposure treatment can be suppressed, the control process proceeds to operation S36 where the peripheral exposure treatment is performed. Meanwhile, if the wafer temperature is determined to be not equal to or less than the predetermined temperature T1 in the operation S310, the control process returns to operation S38 where the second cooling process is continued. That is, the second cooling process of operation S38 is continued until the wafer temperature becomes equal to or less than the predetermined temperature T1.

As described above, according to the fourth peripheral exposure method shown in the operations S31 to S310, even when the wafer temperature is higher than the predetermined temperature T1 in the rapid cooling process, the second cooling process is continued until the wafer temperature becomes equal to or less than the predetermined temperature T1, which makes it possible to more surely suppress the resist droop when removing the resist film R which has been subjected to the peripheral exposure treatment.

<Divisional-Type Cooler>

Figure 13:
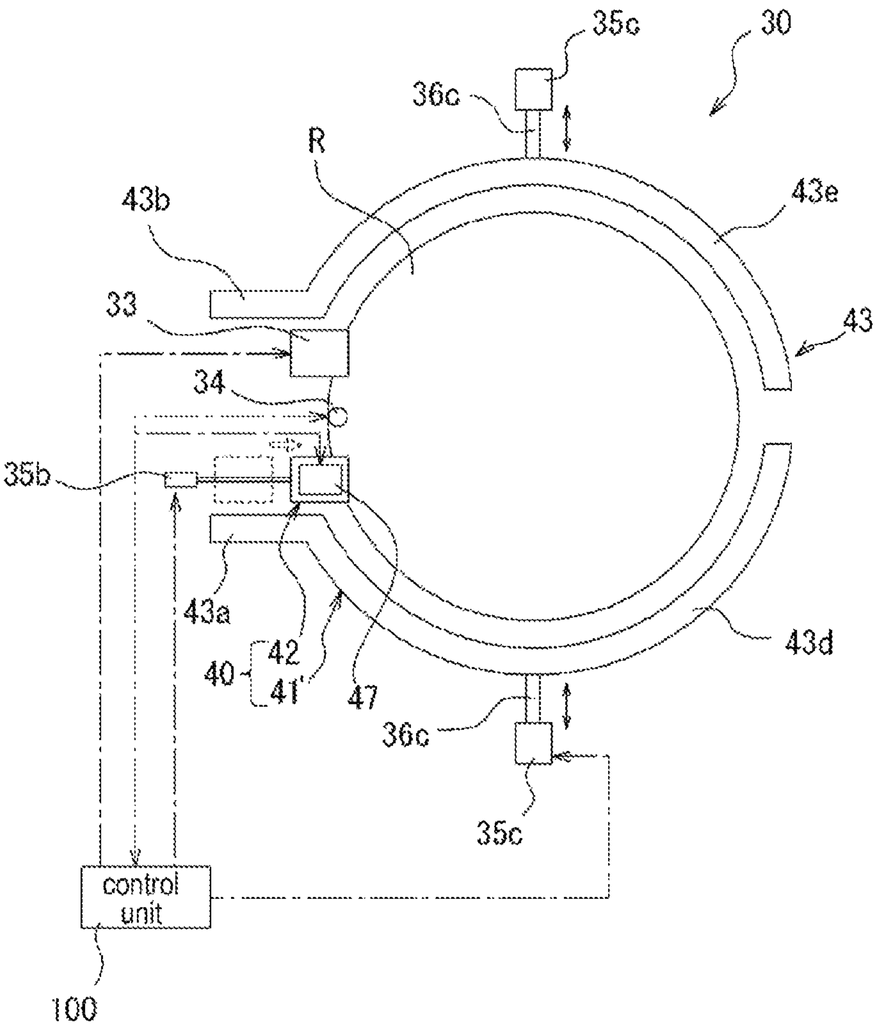
FIG. 13 is a schematic plane view of a divisional-type cooler having first and second coolers which are separated from each other, according to another embodiment.

Next, a divisional-type cooler 41' according to another embodiment will be described with reference to FIG. 13. Components or members identical to those of FIG. 4 will be designated by the same reference numerals but will not be described in detail.

The cooler body 43 includes a first cooler body **43*d* and a second cooler body 43*e* which face each other with the spin chuck 31 interposed therebetween. The first cooler body 43*d* and the second cooler body 43*e* are formed in a substantially semicircle shape when viewed from the top. The first gas supply source 49*a*, which is not shown in FIG. 13, is connected to the first cooler body 43*d* and the second cooler body 43*e*. Further, a cylinder 35*c* as a first cooler moving mechanism is disposed in the first cooler body 43*d* and the second cooler body 43*e***.

During the course of loading/unloading of the wafer W, since a rod **36*c* of the cylinder 35*c* moves in a direction away from the wafer adsorption surface 31*a* of the spin chuck 31, the first cooler body 43*d* and the second cooler body 43*e* wait at a position (the standby position) away from the spin chuck 31. At this time, a distance between the first cooler body 43*d* and the spin chuck 31 may be equal to or different from that between the second cooler body 43*e* and the spin chuck 31. Further, when the wafer W is absorbed on the wafer adsorption surface 31*a* of the spin chuck 31, the rod 36*c* of the cylinder 35*c* moves toward the wafer adsorption surface 31*a* of the spin chuck 31**.

As described above, the first cooler body **43*d* and the second cooler body 43*e* face each other with the spin chuck 31 interposed therebetween, and the cylinder 35*c* is disposed in the first cooler body 43*d* and the second cooler body 43*e*. This allows the first cooler body 43*d* and the second cooler body 43*e*** to be independently moved. Therefore, it is possible to freely set the standby position of the first cooler body

43*d* and the second cooler body 43*e* during the course of the loading/unloading of the wafer W.

<Common Gas Supply Source>

Figure 14:
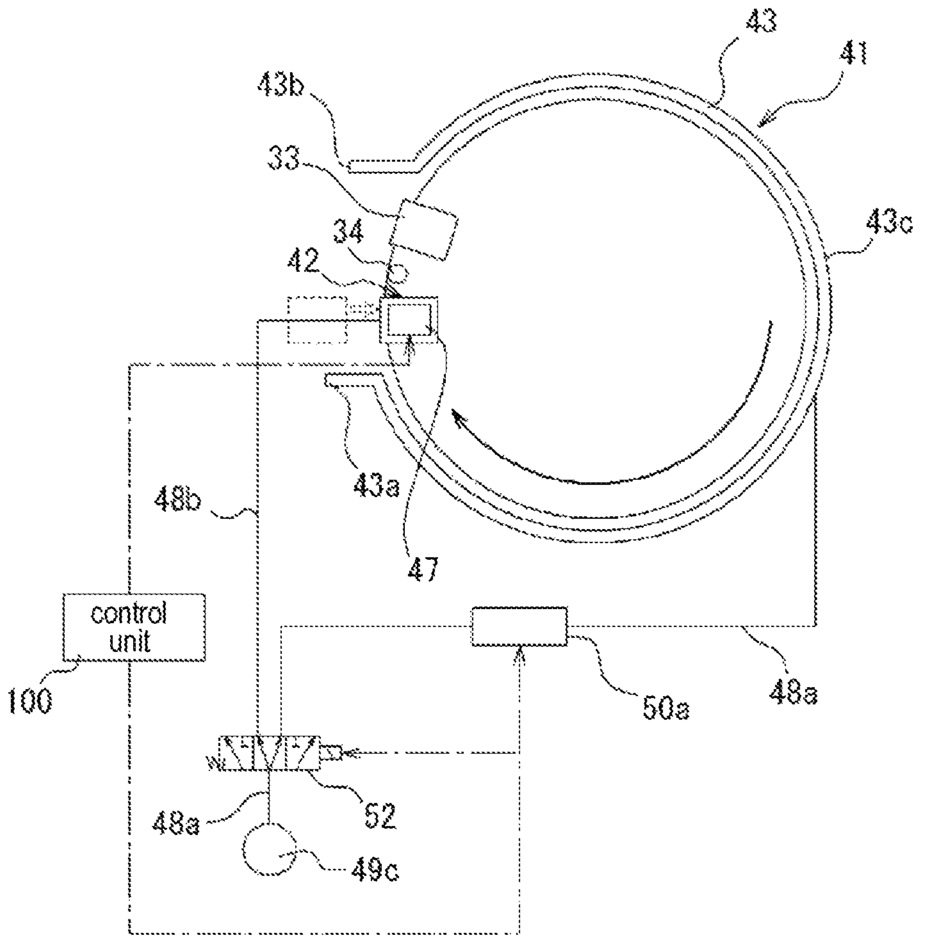
FIG. 14 is a schematic plane view of a cooler using a common gas supply source.

Next, a description of a common gas supply source 49*c* used for the first cooler 41 and the second cooler 42 will be given with reference to FIG. 14. Components or members identical to those of FIG. 7 will be designated by the same reference numerals but will not be described in detail.

The first cooler 41 includes the first supply line 48*a* connected to the cooler body 43, and the first temperature controller 50*a* which is disposed in the first supply line 48*a* and coolant gas supplied from the common gas supply source 49*c*. The second cooler 42 includes the second supply line 48*b* connected to the cooling body 46.

An electromagnetic three-port three-position switching valve 52 is disposed in a portion at which the first supply line 48*a* and the second supply line 48*b* are branched. The switching valve 52 is electrically connected to the control unit 100 and is operated based on a signal provided from the control unit 100 such that the coolant gas discharged from the common gas supply source 49*c* is selectively supplied to any one of the first cooler 41 and the second cooler 42, or both.

With this configuration, in the first cooling process, switching the switching valve 52 allows the coolant gas supplied from the common gas supply source 49*c* to be flown to the first cooler 41 via the first supply line 48*a*. Further, in the second cooling process, switching the switching valve 52 allows the coolant gas supplied from the common gas supply source 49*c* to be flown to the second cooler 42 via the second supply line 48*b*. Further, in the rapid cooling process, switching the switching valve 52 allows the coolant gas supplied from the common gas supply source 49*c* to be flown to the first cooler 41 and the second cooler 42 via the first supply line 48*a* and the second supply line 48*b*, respectively.

<Internal Arrangement of First Cooler Body>

Next, an internal arrangement of the cooler body 43 in which the discharge hole 44*a* is positioned above the resist film R will be described in detail with reference to FIGS. 15A to 15C. Components or members identical to the internal arrangement of the cooler body 43 shown in FIGS. 6A and 6C will be designated by the same reference numerals but will not be described in detail.

Figure 15A:
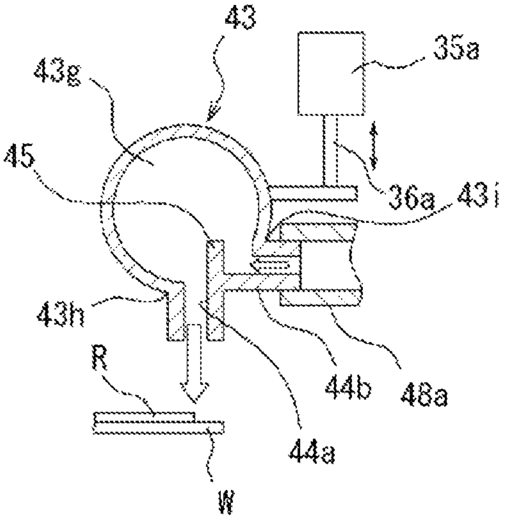
FIGS. 15A to 15C are schematic sectional views showing a cooler body of a first cooler having various shapes, according to another embodiment of the present disclosure, respectively.

As shown in FIG. 15A, the discharge hole 44*a* of the first cooler 41 is formed in the lower portion 43*h* of the cooler body 43. A leading end portion of the discharge hole 44*a* faces an end portion of the resist film R of the wafer W which is absorbed on the wafer adsorption surface 31*a* of the spin chuck 31. Further, the supply hole 44*b* connected to the first supply line 48*a* is formed in a peripheral portion 43*i* of the cooler body 43.

With this configuration, the coolant gas supplied from the first gas supply source 49*a* is bypassed by the bypass plate 45 and subsequently, and is discharged from the discharge hole 44*a* after moving along the inner wall 43*g* of the cooler body 43, makes it possible to suppress the pulsation of the coolant gas discharged from the discharge hole 44*a*.

Figure 15B:
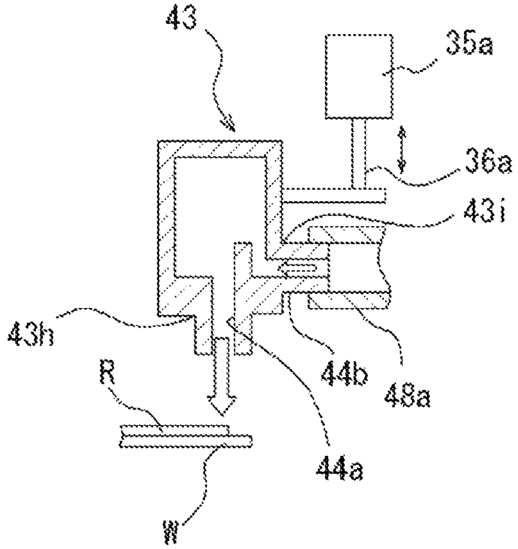
Figure 15C:
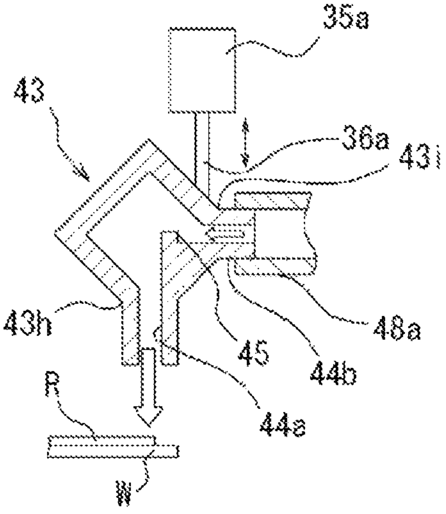

In some embodiments, as shown in FIGS. 15B and 15C, a cross section of the cooler body 43 in the rotational direction of the spin chuck 31 may be a rectangular shape or a rhomboidal shape. Such a shape prevents the pulsation of the coolant gas discharged from the discharge hole 44*a*.

<Configuration of Peripheral Exposure Apparatus According to Another Embodiment>

Next, a configuration of another peripheral exposure apparatus 30' according to another embodiment of the present disclosure in which the cylinder 35*c* of the first cooler 41 is disposed above the spin chuck 31 will be described with reference to FIG. 16. Components or members identical to those of the peripheral exposure apparatus 30 shown in FIGS. 4A and 4B will be designated by the same reference numerals but will not be described in detail.

Figure 16:
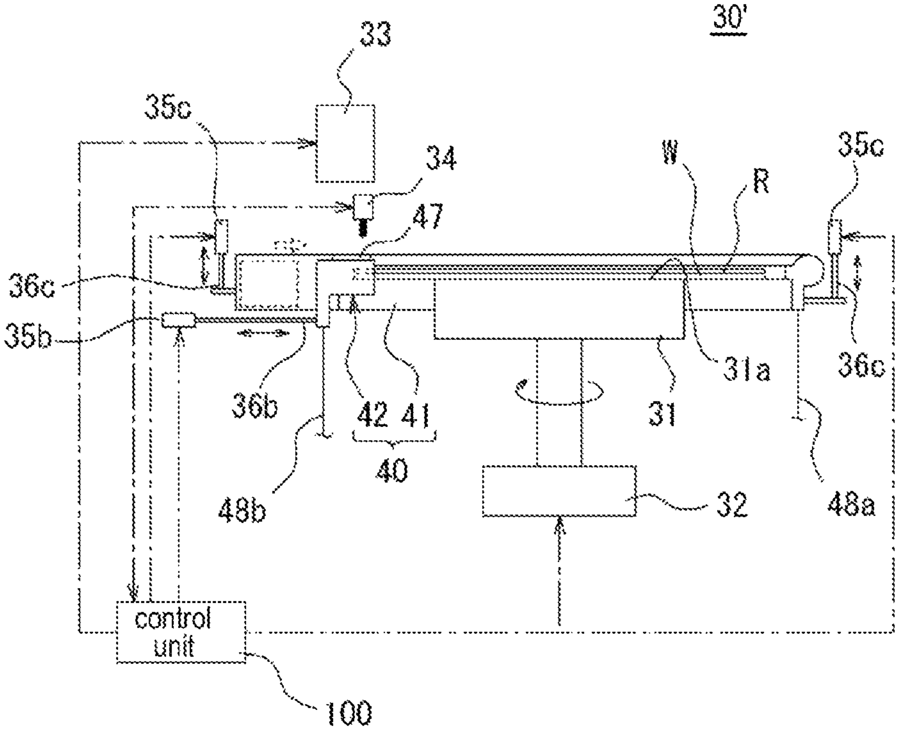
FIG. 16 is a front view of a peripheral exposure apparatus in which an installation position of a moving mechanism is changed, according to another embodiment of the present disclosure.

In the peripheral exposure apparatus 30' shown in the FIG. 16, the cylinder 35*c* as the first cooler moving mechanism configured to move the cooler body 43 upward and downward is disposed at the upper portion of the cooler body 43 of the first cooler 41. When the peripheral exposure treatment is performed, the rod 36*c* of the cylinder 35*c* moves upward so that the cooler body 43 moves to the position in the vicinity of the upper surface of the wafer W. When loading/unloading of the wafer W is performed, the rod 36*c* of the cylinder 35*c* moves downward so that the cooler body 43 moves above the wafer adsorption surface 31*a* of the spin chuck 31.

With this configuration, even when the cylinder 35*c* and the rod 36*c* are disposed at the upper side of the cooler body 43 of the first cooler 41, it is possible to form a space within which the wafer W is loaded on and unloaded from the wafer adsorption surface 31*a* of the spin chuck 31.

<Configuration of Peripheral Exposure Apparatus According to Still Another Embodiment>

Next, a configuration of a peripheral exposure apparatus 30" according to still another embodiment of the present disclosure will be described with reference to FIGS. 17A and 17B, wherein the peripheral exposure apparatus 30" includes the first cooler 41 configured to move to the standby position by the rotation operation. Components or members identical to those of the peripheral exposure apparatus 30 shown in FIGS. 4A and 4B will be designated by the same reference numerals but will not be described in detail.

Figure 17A:
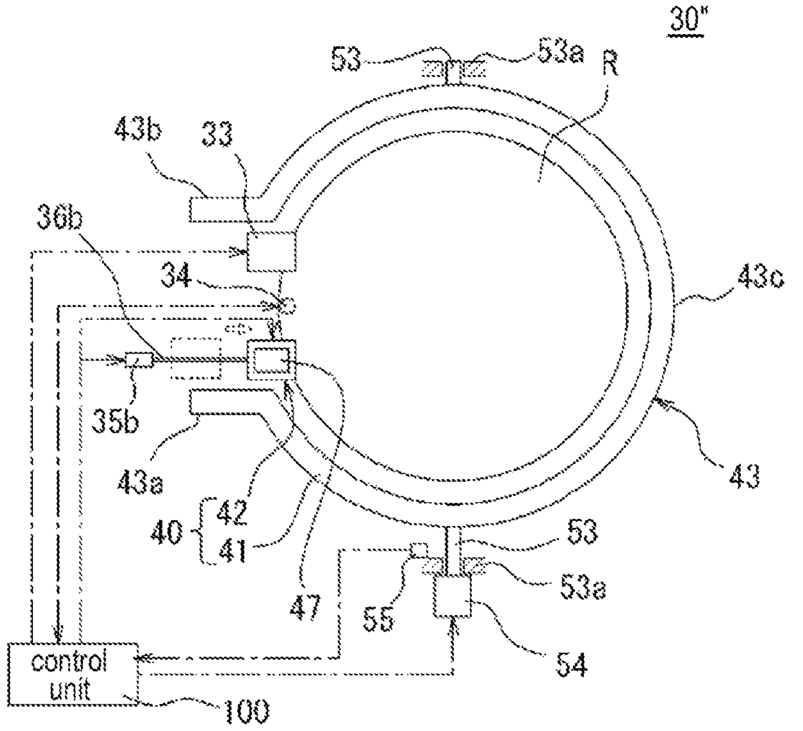
FIG. 17A is a schematic plane view of a peripheral exposure apparatus in which a configuration of the moving mechanism is changed, according to another embodiment of the present disclosure.
Figure 17B:
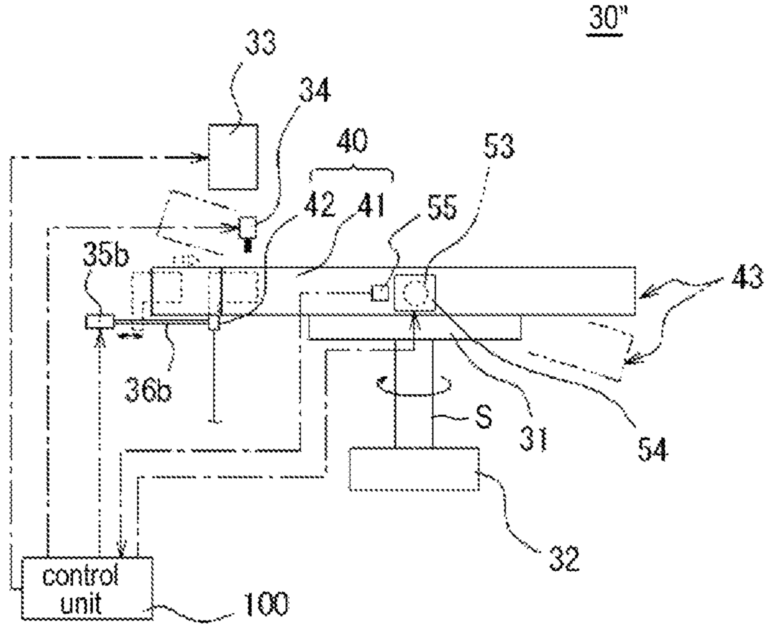
FIG. 17B is a schematic side view of the peripheral exposure apparatus shown in FIG. 17A.

As shown in FIGS. 17A and 17B, two rotary shafts 53 which are perpendicular to the rotation shaft S of the spin chuck 31 are formed at two sides which are perpendicular to a portion excluding the exposure region E in the cooler body 43 of the first cooler 41, respectively. The rotary shafts 53 are supported to be rotatable by bearings 53*a*, respectively. A motor 54 as a driving unit is connected to one of the rotary shafts 53 such that the rotary shaft 53 is rotated by a rotational driving of the motor 54. The rotary shaft 53 is pivotably supported by an outer peripheral portion of the cooler body 43 so that the rotary shaft 53 rotates together with the cooler body 43 by the rotational driving of the motor 54. Further, a rotational angle of the rotary shaft 53 is detected at an angle sensor 55.

The motor 54 and the angle sensor 55 are electrically connected to the control unit 100. The motor 54 is driven based on a control signal provided from the control unit 100. The motor 54 and the cooler body 43 rotate together such that the cooler body 43 is transferred between a use position, i.e., the position in the vicinity of the periphery of the wafer W absorbed on the spin chuck 31, and the standby position. The angle sensor 55 detects a rotational angle of the motor 54 and sends the same to the control unit 100.

When loading/unloading of the wafer W is performed, the first cooler 41 moves the standby position. In this case, the motor 54 is driven based on a control signal provided from the control unit 100 so that the rotary shaft 53 and the arc-shaped first cooler 41 rotate together. The rotational angle of the rotary shaft 53 is detected by the angle sensor 55. When the rotational angle of the rotary shaft 53 becomes a predetermined angle, a signal detected by the angle sensor 55 is transmitted to the control unit 100. Then, the transmission of the control signal from the control unit 100 to the motor 54 is stopped and the driving of the motor 54 is stopped. Upon stopping the driving of the motor 54, as shown by a dashed double-dotted line in FIG. 17B, the first cooler 41 stops at a position (the standby position) inclined with respect to the wafer adsorption surface 31*a* of the spin chuck 31.

When the cooling process is performed on the loaded wafer W, similarly to when loading/unloading of the wafer W is performed, the motor 54 is driven based the control signal provided from the control unit 100 so that the rotary shaft 53 and the arc-shaped first cooler 41 rotate together in a reverse direction of the aforementioned direction. Then, the first cooler 41 stops at a position (the position in the vicinity of the upper surface) parallel to the wafer adsorption surface 31*a* of the spin chuck 31.

With this configuration, by rotating the cooler body 43 of the first cooler 41, it is possible to form a space within which the wafer W is loaded on and unloaded from the wafer adsorption surface 31*a* of the spin chuck 31.

Other Embodiments

Figure 18A:
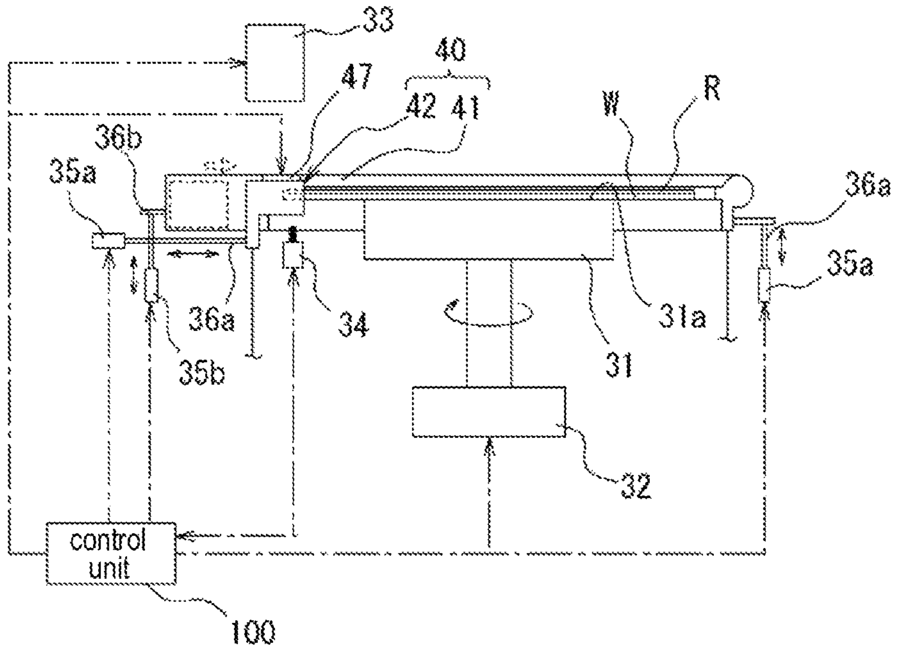
FIG. 18A is a schematic side view of a peripheral exposure apparatus in which an installation position of the temperature sensor is changed, according to another embodiment of the present disclosure.
Figure 18B:
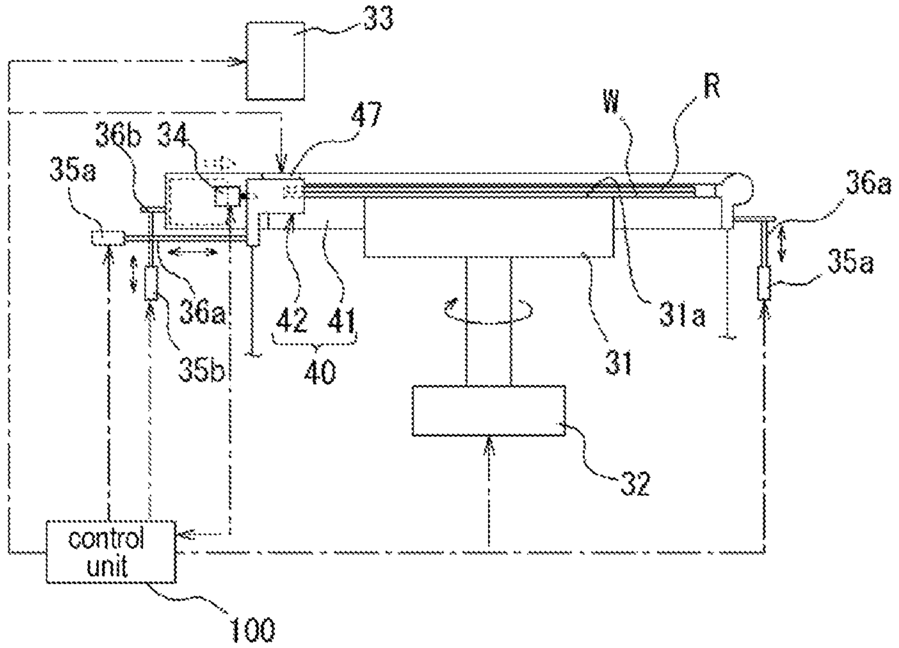
FIG. 18B is a schematic side view of a peripheral exposure apparatus in which an installation position of the temperature sensor is changed, according to another embodiment of the present disclosure.

Further, while in this embodiment, the temperature sensor 34 according to the present disclosure has been described to be disposed above the spin chuck 31, the present disclosure is not limited thereto. For example, as shown in FIGS. 18A and 18B, the temperature sensor 34 may be disposed a lower surface (or rear surface) of the spin chuck 31 or to face the outer peripheral surface thereof. With this configuration, although the temperature sensor 34 is disposed at the lower surface (or the rear surface) of the spin chuck 31 or to face the outer peripheral surface thereof, the temperature of the wafer W can be measured similarly to when the temperature sensor 34 is disposed to face the upper surface of the spin chuck 31, which makes it possible to freely set an installation position of the temperature sensor 34.

While in this embodiment, the peripheral exposure method (apparatus) according to the present disclosure has been described to be applied to the resist coating/developing system for semiconductor wafer, the present disclosure is not limited thereto. For example, the present disclosure is also applicable to a resist coating/developing system which is employed for a glass substrate for LCD.

According to the present disclosure configured as above, since coolant gas is brought into contact with a periphery of a resist film of a substrate to be processed and the substrate to be processed is cooled until its temperature becomes equal to or less than a predetermined temperature, it is possible to set the temperature of the substrate to be processed before a peripheral exposure to be equal to or less than the predetermined temperature in a relatively short period of time. Further, since an exposure process is performed when the temperature of the substrate to be processed becomes equal to or less than the predetermined temperature, it is possible to surely remove a surplus resist film which remains at the periphery of the resist film. Therefore, it is possible to perform a cooling of the substrate to be processed, which is required to surely remove the surplus resist film, in a relatively short period of time, thus enhancing efficiency in peripheral exposure treatment.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A peripheral exposure method for performing an exposure treatment by illuminating light to a periphery of a resist film formed on a substrate to be processed, the method comprising:

rotating the substrate to be processed on a horizontal plane;

supplying a flow of a coolant gas only to the periphery of the resist film of the substrate to be processed which is being rotated, from a vicinity of the periphery, and cooling the substrate to be processed through heat transfer between the substrate and the coolant being in direct contact with the substrate; and measuring a temperature of the substrate to be processed, wherein when the temperature of the substrate to be processed is equal to or less than a predetermined temperature, the exposure treatment is performed.

2. The method of claim 1, wherein the cooling includes:

a first cooling where the coolant gas is brought into contact with an outer peripheral portion excluding an exposure region of the periphery of the resist film of the substrate to be processed which is being rotated and cooling the substrate to be processed; and a second cooling where the coolant gas is brought into contact with an upstream side of a rotational direction of the exposure region of the periphery of the resist film of the substrate to be processed which is being rotated, wherein a temperature of the coolant gas used in the second cooling is equal to or less than that of the coolant gas used in the first cooling.

3. The method of claim 2, wherein after the substrate to be processed is cooled by the first cooling, the temperature of the substrate to be processed is measured by the measuring;

when the temperature of the substrate to be processed is equal to or less than the predetermined temperature, performing the exposure treatment; and when the temperature of the substrate to be processed is higher than the predetermined temperature, performing a rapid cooling in which the first cooling and the second cooling are simultaneously performed, and subsequently, performing the exposure treatment.

4. The method of claim 3, wherein the cooling of the substrate to be processed using the rapid cooling is performed until the temperature of the substrate to be processed becomes equal to or less than the predetermined temperature.

5. The method of claim 2, wherein after the substrate to be processed is cooled by a rapid cooling in which the first cooling and the second cooling are simultaneously performed, the temperature of the substrate to be processed is measured by the measuring;

when the temperature of the substrate to be processed is equal to or less than the predetermined temperature, performing the exposure treatment; and when the temperature of the substrate to be processed is higher than the predetermined temperature, performing the second cooling and subsequently, performing the exposure treatment.

6. The method of claim 5, wherein the cooling of the substrate to be processed using the latter second cooling is performed until the temperature of the substrate to be processed becomes equal to or less than the predetermined temperature.

7. The method of claim 2, wherein the temperature of the coolant gas which is brought into contact with the peripheral portion of the substrate to be processed in the first cooling, is 20 to 25 degrees C., wherein the temperature of the coolant gas which is brought into contact with the peripheral portion of the substrate to be processed in the second cooling, is 15 to 20 degrees C.

8. The method of claim 1, wherein the coolant gas is any one of a dry air, a nitrogen gas and a helium gas.

9. The method of claim 1, wherein the predetermined temperature is equal to or less than 42 degrees C.

* * * * *